(12) United States Patent
Cherry et al.

(10) Patent No.: US 9,500,719 B2
(45) Date of Patent: Nov. 22, 2016

(54) LED LIGHT STRING DIAGNOSTIC AND REPAIR SYSTEM

(71) Applicant: Ulta-Lit Tree Co., Glenview, IL (US)

(72) Inventors: Dennis Blair Cherry, Dallas, TX (US); John DeCosmo, Glenview, IL (US); Howard L. Frank, Skokie, IL (US)

(73) Assignee: ULTA-LIT TREE CO., Glenview, IL (US)

( * ) Notice: Subject to any disclaimer, the term of this patent is extended or adjusted under 35 U.S.C. 154(b) by 253 days.

(21) Appl. No.: 14/356,819

(22) PCT Filed: Nov. 1, 2012

(86) PCT No.: PCT/US2012/062911
§ 371 (c)(1),
(2) Date: May 7, 2014

(87) PCT Pub. No.: WO2013/070475
PCT Pub. Date: May 16, 2013

(65) Prior Publication Data
US 2014/0304961 A1    Oct. 16, 2014

Related U.S. Application Data

(60) Provisional application No. 61/556,745, filed on Nov. 7, 2011, provisional application No. 61/578,159, filed on Dec. 20, 2011, provisional application No. 61/656,432, filed on Jun. 6, 2012.

(51) Int. Cl.
| | |
|---|---|
| *G01R 31/26* | (2014.01) |
| *G01R 31/44* | (2006.01) |
| *H05B 33/08* | (2006.01) |
| *F21S 2/00* | (2016.01) |
| *G01R 1/00* | (2006.01) |

(52) U.S. Cl.
CPC ........... *G01R 31/44* (2013.01); *G01R 31/2635* (2013.01); *H05B 33/089* (2013.01); *F21S 2/00* (2013.01); *F21S 2017/00* (2013.01); *G01R 1/00* (2013.01); *Y10T 29/49732* (2015.01)

(58) Field of Classification Search
CPC ........ F21S 2/00; F21S 11/00; F21S 2017/00; F21V 1/00; F21V 15/00; G01R 1/00; H05B 31/00
See application file for complete search history.

(56) References Cited

U.S. PATENT DOCUMENTS

| | | |
|---|---|---|
| 4,024,418 A | 5/1977 | Hankel |
| 4,984,999 A | 1/1991 | Leake |
| 5,319,312 A | 6/1994 | Segilia |
| 5,604,436 A | 2/1997 | Henritzy et al. |

(Continued)

OTHER PUBLICATIONS

Search Report and Written Opinion for International Application No. PCT/US2012/062911 dated Jan. 22, 2013 (16 pages).

*Primary Examiner* — Jermele M Hollington
*Assistant Examiner* — Temilade Rhodes-Vivour
(74) *Attorney, Agent, or Firm* — Nixon Peabody LLP

(57) ABSTRACT

According to one embodiment, a diagnostic device (8) for identifying a defect in an LED light string includes a probe (18) and a polarity selector switch (16). The LED light string includes a conductor provided within an insulation layer. The probe (18) is configured to penetrate the insulation layer and contact the conductor of an LED light string. The polarity selector switch (16) is electrically coupled to the probe (18) and configured to control the polarity of an electrical waveform provided to the probe (18).

26 Claims, 22 Drawing Sheets

(56) References Cited

U.S. PATENT DOCUMENTS

| | | |
|---|---|---|
| 6,433,530 B1 | 8/2002 | Pool |
| 7,432,717 B2 * | 10/2008 | Frederick ............... F21S 9/04 324/414 |
| 7,964,839 B1 * | 6/2011 | Langley .................. G01J 1/02 250/214 R |
| 2002/0084779 A1 | 7/2002 | Shigeta |
| 2002/0135376 A1 * | 9/2002 | Frederick ............... F21S 9/04 324/414 |
| 2005/0024877 A1 * | 2/2005 | Frederick ............... F21S 9/04 362/277 |
| 2005/0242822 A1 | 11/2005 | Klinger et al. |
| 2006/0097726 A1 | 5/2006 | Frederick et al. |
| 2012/0126718 A1 * | 5/2012 | Shan .................. G01R 31/2635 315/294 |

* cited by examiner

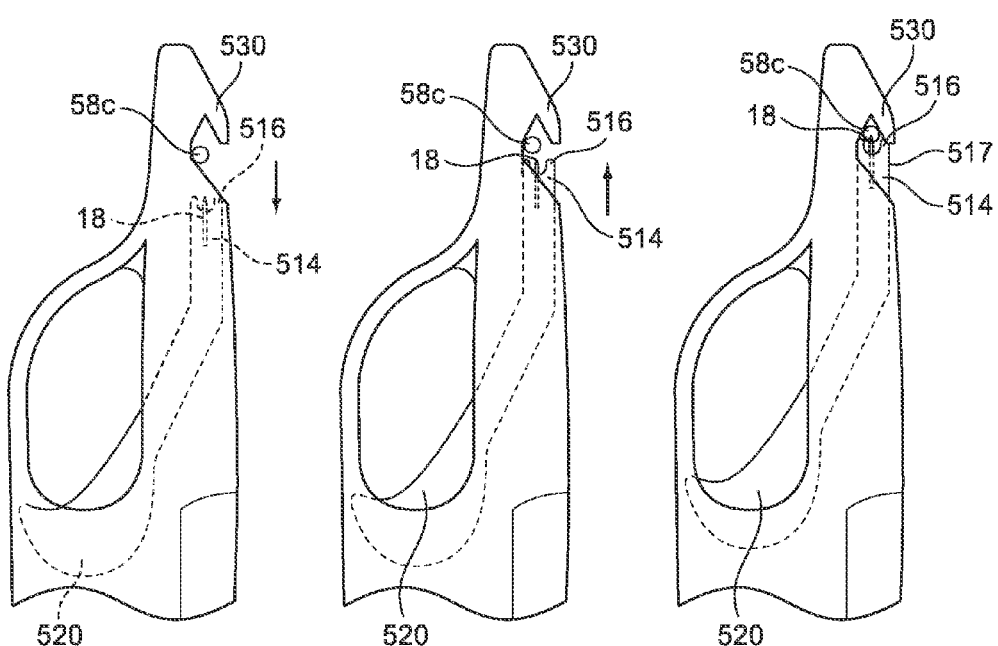

LED LIGHT STRING DIAGNOSTIC AND REPAIR SYSTEM

CROSS-REFERENCE TO RELATED APPLICATIONS

This application is a U.S. national stage of International Application No. PCT/US2012/062911, titled "LED Light String Diagnostic And Repair System," and filed Nov. 1, 2012, which claims priority to U.S. Provisional Application No. 61/656,432 filed on Jun. 6, 2012, U.S. Provisional Application No. 61/578,159 filed on Dec. 20, 2011, and U.S. Provisional Application No. 61/556,745 filed on Nov. 7, 2011, each of which is incorporated by reference in its entirety.

TECHNICAL FIELD

The following disclosure relates generally to devices and methods for identifying and repairing defects in decorative LED light strings.

BACKGROUND

One of the most common uses of series-connected light strings is for decoration and display purposes, particularly during Christmas and other holidays. Such light strings are particularly popular for the decoration of the residential, commercial, and industrial buildings, trees, shrubbery, and the like.

In the past, decorative light strings typically included a number of incandescent bulbs connected in series. More recently, however, decorative light strings often include light emitting diodes (hereinafter "LEDs") instead. LED decorative light strings typically require less electricity to operate, generate less heat, and last longer than incandescent bulb light strings. Despite these improvements, LEDs still have a limited lifespan or can otherwise fail due to broken wires, overload currents, corroded leads, or related issues. At some point, one or more of the LEDs will burn out or fail, and the defective LED must be replaced.

Because the LEDs of many LED light strings are connected in series, the failure of one or more LEDs may cause a portion or all of the remaining LEDs (depending on the configuration of the light string) to no longer illuminate. In light strings having replaceable LEDs, the defective LED can be replaced with a new LED; however, a significant problem thus exists in that usually many LEDs have to be checked to find the defective LED. In fact, in many instances, the frustration and time-consuming efforts are so great as to cause one to completely discard and replace the string with a new string. Additionally, replacement does not offer a practical solution if the lights are on an already decorated Christmas tree where removal would cause damage to the ornaments or on wire frame yard decorations where the lights have many clips and wire ties holding them to the frame. Moreover, in light strings that do not have replaceable LEDs, the problem of identifying and repairing a defective LED is significantly more complicated, inconvenient, and impractical for the average light string owner.

SUMMARY

According to one embodiment, a diagnostic device for identifying a defect in an LED light string includes a probe and a polarity selector switch. The LED light string includes a conductor provided within an insulation layer. The probe is configured to penetrate the insulation layer and contact the conductor of an LED light string. The polarity selector switch is electrically coupled to the probe and configured to control the polarity of an electrical waveform provided to the probe.

According to another embodiment, a diagnostic device for identifying a defect in an LED light string includes a probe and a polarity selector switch. The LED light string includes a conductor provided within an insulation layer. The LED light string further includes a plurality of LEDs each coupled to a respective one of a plurality of LED sockets. The probe is configured to couple to an LED socket to contact the conductor of an LED light string. The polarity selector switch is electrically coupled to the probe and configured to control the polarity of an electrical waveform provided to the probe.

According to another embodiment, a method is provided for identifying a defect in an LED light string. The LED light string includes a conductor provided within an insulation layer. The method includes providing a diagnostic device that includes a probe configured to penetrate the insulation layer of the LED light string and electrically couple to the conductor of the LED light string, and a polarity selector switch configured to control the polarity of a waveform provided by the probe to the conductor of the LED light string. The method further includes penetrating the insulation layer on the LED light string with the probe to electrically couple the probe with the conductor of the LED light string at a testing location. Additionally, the method includes providing a first electrical waveform from the probe to the conductor of the LED light string, and providing a second electrical waveform from the probe to the conductor of the LED light string. The first electrical waveform has a positive polarity and the second electrical waveform has a negative polarity.

According to a further embodiment, a method is provided for identifying a defect in an LED light string. The LED light string includes a conductor provided within an insulation layer. The LED light string also includes a plurality of LEDs coupled to a respective one of a plurality of LED sockets. The method includes providing a diagnostic device that includes a probe configured to couple to an LED socket to electrically couple to the conductor of the LED light string, and a polarity selector switch configured to control the polarity of a waveform provided by the probe to the conductor of the LED light string. The method further includes coupling the probe to the LED socket to electrically couple the probe to the conductor of the LED light string at a testing location. Additionally, the method includes providing a first electrical waveform from the probe to the conductor of the LED light string, and providing a second electrical waveform from the probe to the conductor of the LED light string. The first electrical waveform having a positive polarity and the second electrical waveform has a negative polarity.

According to a further embodiment, a kit for identifying and repairing a defect in an LED light string includes a diagnostic device and a repair device. The diagnostic device includes a probe, a polarity selector switch, and a power conversion module. The probe is configured to penetrate an insulation layer and contact a conductor of an LED light string. The polarity selector switch is electrically coupled to the probe and configured to control the polarity of an electrical waveform provided to the probe. The power conversion module is configured to be selectively coupled to the polarity selector switch at a positive output and a negative output. The power conversion module is also configured to provide a positive polarity waveform at the positive output and a negative polarity waveform at the negative output. The repair device includes a repair device housing, and a resistor disposed within the repair housing. The resistor includes a first wire-piercing element and a second wire-piercing element. The first wire-piercing element and the second wire-piercing element are configured to penetrate the insulation layer and contact the conductor of the LED light string.

According to yet another embodiment, a diagnostic device for identifying a defect in an LED light string includes a probe, a polarity selector switch, a power conversion module, and a plug. The LED light string includes a conductor provided within an insulation layer. The probe is configured to penetrate the insulation layer and contact the conductor of an LED light string. The polarity selector switch is configured to be electrically coupled to the probe and configured to control the polarity of an electrical waveform provided to the probe. The power conversion module is configured to be selectively coupled to the polarity selector switch at a positive output and a negative output. The power conversion module is configured to provide a positive polarity waveform at the positive output and a negative polarity waveform at the negative output. The power conversion module includes a diode bridge configured to provide full-wave rectification, a first resistor coupled to the positive output, and a second resistor coupled to the negative output. The plug is configured to electrically couple the power conversion module to an AC electrical power source. The polarity selector switch includes a center-off position in which the probe is not electrically coupled to the positive output and the probe is not electrically coupled to the negative output. The polarity selector switch further includes a negative position in which the probe is electrically coupled to the negative output, and the polarity selector switch includes a positive position in which the probe is electrically coupled to the positive output.

According to another embodiment, a diagnostic device for identifying a defect in an LED light string. The LED light string includes a conductor provided within an insulation layer. The diagnostic device includes a power source configured to provide a DC electrical power. The diagnostic device also includes a power conversion module coupled to the power source. The power conversion module is configured to receive the DC electrical power, change the DC electrical power to an AC electrical power, and provide the AC electrical power to a first output and a second output. The diagnostic device further includes a probe coupled to the first output of the power conversion module. The probe is configured to electrically couple to the conductor of an LED light string. Additionally, the diagnostic device includes an electrical socket coupled to the second output of the power conversion module. The electrical socket is configured to couple to a plug of the LED light string.

According to another embodiment, a method is provided for identifying a defect in an LED light string. The LED light string includes a conductor provided within an insulation layer. The method includes coupling the LED light string to a diagnostic device. The diagnostic device includes a power source configured to provide a DC electrical power, a power conversion module coupled to the power source, a probe coupled to the power conversion module and configured to electrically couple to the conductor of an LED light string, and an electrical socket coupled to the power conversion module and configured to couple to a plug of the LED light string. The method further includes receiving, at the power conversion module, the DC electrical power from the power source, and converting, via the power conversion module, the DC electrical power to an AC electrical power. The method also includes providing the AC electrical power to a first output and a second output of the power conversion module. The probe is coupled to the first output and the electrical socket is coupled to the second output. The method further includes electrically coupling the probe with the conductor of the LED light string at a testing location and providing the AC electrical power from the probe to the conductor of the LED light string.

The above summary is not intended to represent each embodiment or every aspect of the present invention(s). The detailed description and Figures will describe many of the embodiments and aspects of the present invention(s).

BRIEF DESCRIPTION OF THE DRAWINGS

FIG. 10D-10F are illustrations of a partial side view of the diagnostic device illustrated in FIG. 10A and a wire of a decorative LED light string.

Figure 1:
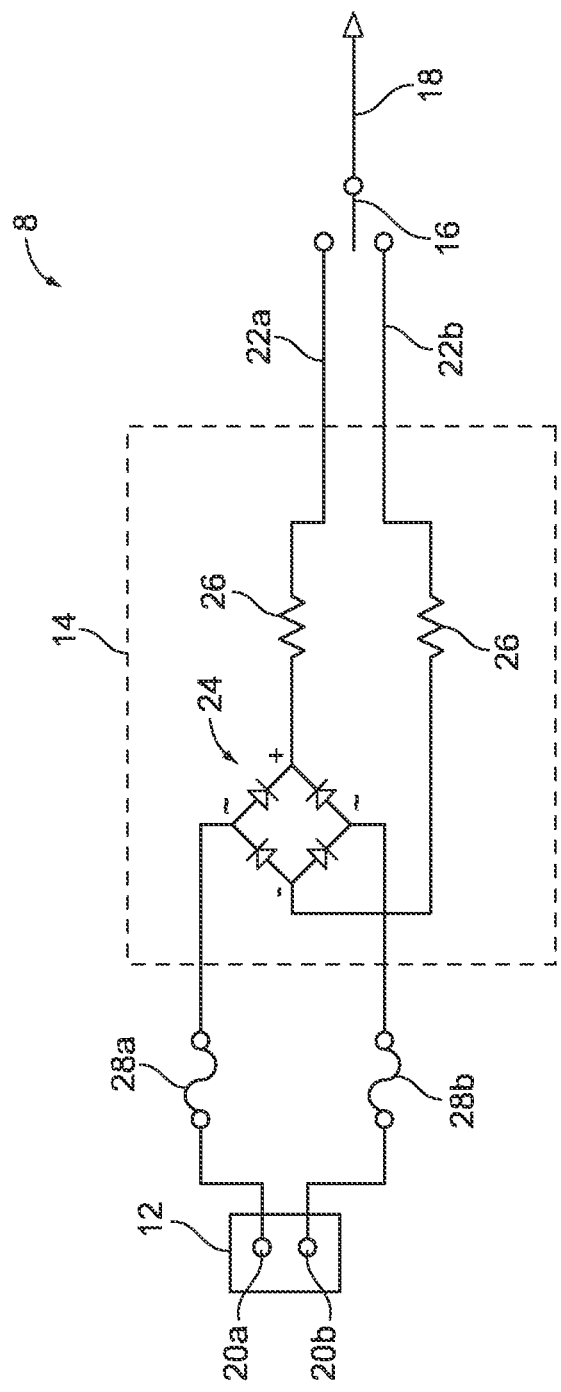
FIG. 1 is a diagram of a diagnostic device circuit according to aspects of the present invention.

While the invention(s) are susceptible to various modifications and alternative forms, specific embodiments have been shown by way of example in the drawings and will be described in detail herein. It should be understood, however, that the invention(s) are not intended to be limited to the particular forms disclosed. Rather, the invention(s) are to cover all modifications, equivalents, and alternatives falling within the spirit and scope of the invention.

DETAILED DESCRIPTION OF ILLUSTRATED EMBODIMENTS

FIG. 1 illustrates a diagram of an exemplary diagnostic device circuit 8 for identifying defects in an LED light string. As shown in FIG. 1, the diagnostic device circuit 8 includes a plug 12, a power conversion module 14, a polarity selector switch 16, and a probe 18.

The plug 12 is configured to couple to an electrical power socket (e.g., a standard AC electrical outlet) of an electrical power source (e.g., an electrical power grid). The plug 12 includes two contacts 20a, 20b such as, for example, pins, prongs, and/or blades that mechanically and electrically couple to corresponding holes and/or slots in the electrical power socket. One of the contacts is a hot contact 20a, which passes electrical power from the electrical power source to the diagnostic device circuit 8, and the other contact is a neutral contact 20b, which returns electrical power from the diagnostic device circuit 8 to the electrical power source.

While the plug 12 illustrated in FIG. 1 includes two contacts, it is contemplated that in some instances, the plug 12 can include two or more hot contacts 20a and/or an additional contact for grounding the housing of the plug 12. It is further contemplated that the contacts can be configured according to any suitable configuration so as to allow for mechanical and electrical coupling with a corresponding electrical power socket. For example, the contacts of the plug 12 can be configured to meet any domestic or international adapted and socket configuration including, but not limited to, NEMA 1-15, NEMA 5-15, JIS C 8303, CEE 7/16, CEE 7/17, BS 4573, BS 546, CEE 7/4, Gost 7396, CEE 7/7, BS 1363, SI 32, AS 3112, CPCS-CCC, IRAIVI 2073, SEV 1011, CEI 23-16/VII, and CEI 23-5. Additionally, it is contemplated that the plug 12 can include holes and/or slots for coupling to a socket that includes pins, prongs, and/or blades. It is also contemplated that the plug 12 can include an indicator light (not shown) to provide an indication as to whether the plug 12 is receiving electrical power from the electrical power source.

The plug 12 is electrically coupled to the power conversion module 14. The power conversion module 14 includes electronic circuitry for processing the electrical power received from the electrical power source so as to provide an electrical power suitable for use by the diagnostic device circuit 8. In particular, the power conversion module 14 is configured to provide a positive waveform at a positive output 22a and a negative waveform at a negative output 22b. For example, in the circuit illustrated in FIG. 1, the power conversion module 14 includes a diode bridge 24 that is configured to receive an AC power source from the plug contacts 20a, 20b and provide a positive full-wave rectified waveform at the positive output 22a and a negative full-wave rectified waveform at the negative output 22b. However, it is contemplated that the waveform provided at the positive output 22a and the negative output 22b need not be a full-wave rectified waveform so long as the waveform at the positive output 22a has a positive polarity and the waveform at the negative output 22b has a negative polarity.

Additionally, the power conversion module 14 can include electronic circuitry for limiting the magnitude of a current provided at the positive output 22a and the negative output 22b of the power conversion module 14. For example, in the circuit illustrated in FIG. 1, the power conversion module 14 includes a resistor 26 electrically coupled between each of the outputs of the diode bridge 24 and the positive and negative outputs 22a, 22b. The resistors 26 limit the current levels of the positive full-wave rectified waveform and the negative full-wave rectified waveform to a suitable level for use with the diagnostic device circuit 8. As one non-limiting example, the resistors 26 can be 8.2 k$\Omega$ resistors. However, any other suitable resistor value can be utilized. According to some aspects, the magnitude of current can be limited such that an LED of an LED light string is not subjected to a current magnitude that is greater than the safe operating conditions of an LED. For example, the value of the resistors 26 can be such that the magnitude of the current at the positive output 22a and the negative output 22b is in a range of approximately 1 mA to approximately 20 mA. Additionally, for example, the magnitude of the current can be limited so as to prevent or mitigate the risk of damage to an LED light string or the diagnostic device 10 in a short circuit condition between the LED light string and the diagnostic device 10 (e.g., if the probe 18 is coupled to the wrong wire of an LED light string while powered). Limiting the magnitude of the current can also mitigate risks of electrical shock to a user or accidental destruction of LEDs due to currents having excessive magnitudes.

The probe 18 is electrically coupled to the power conversion module 14 by the polarity selector switch 16. More particularly, the polarity selector switch 16 is configured to electrically couple the probe 18 to the positive output 22a of the power conversion module 14, to the negative output 22b of the power conversion module 14, or to no output of the power conversion module 14. As such, the polarity selector switch 16 has an open state when the probe 18 is not electrically coupled to either the positive output 22a or the negative output 22b, a positive closed state when the probe 18 is electrically coupled to the positive output 22a, and a negative closed state when the probe 18 is electrically coupled to the negative output 22b.

Optionally, the diagnostic device circuit 8 can further include electronic circuitry for protecting the diagnostic device from a current overload condition. For example, in the illustrated embodiment of FIG. 1, the diagnostic device circuit 8 includes a first fuse 28a and a second fuse 28b electrically coupling the power conversion module 14 to the hot contact 20a and the neutral contact 20b of the plug 12, respectively. The first fuse 28a and the second fuse 28b can have any suitable maximum current rating for protecting against an overload such as, for example, a rating of three amps. It is contemplated that according to some aspects, the first fuse 28a and the second fuse 28b can be replaceable.

Figure 2:
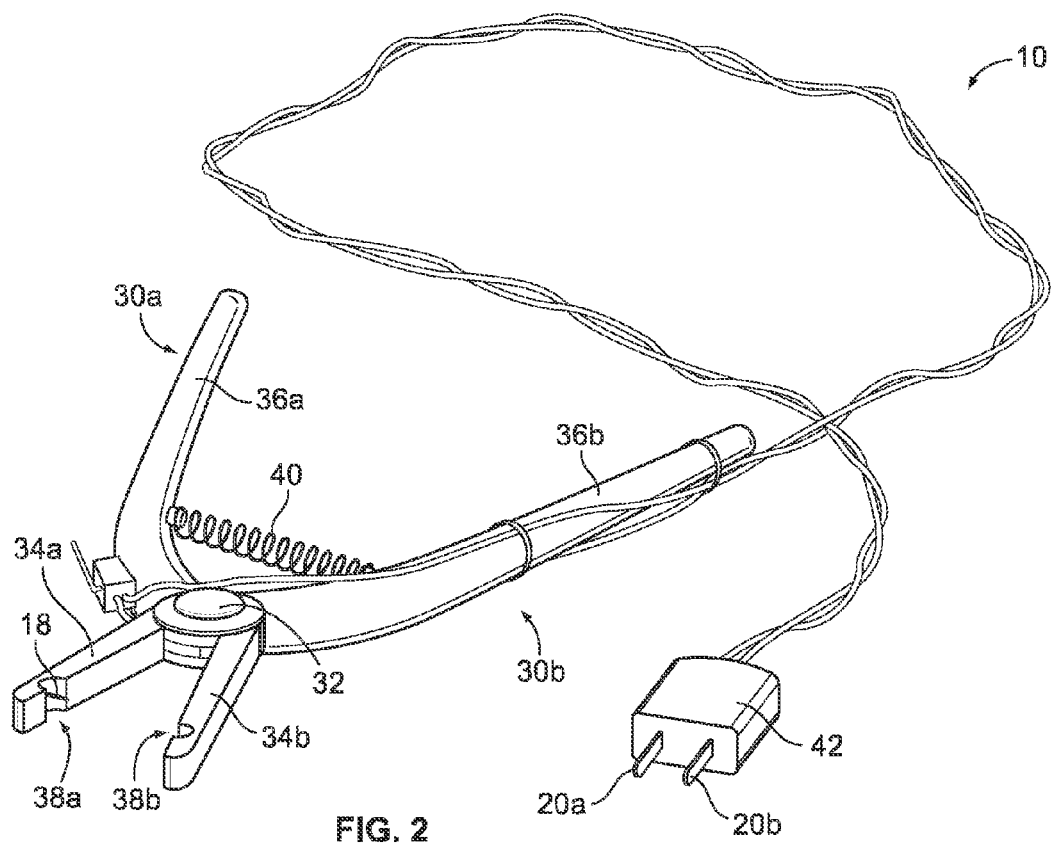
FIG. 2 is an illustration of an exemplary diagnostic device for the circuit diagram illustrated in FIG. 1.

FIG. 2 illustrates an exemplary diagnostic device 10 for implementing the diagnostic device circuit 8 illustrated in FIG. 1. The diagnostic device 10 includes a pair of levers 30a, 30b joined at a fulcrum 32, defining a pair of opposing jaws 34a, 34b and a pair of opposing handles 36a, 36b generally in the shape of pliers. A notch 38a, 38b is formed in an inner surface of each jaw 34a, 34b. The notches 38a, 38b are configured to receive a wire of an LED light string, as will be described in detail below. In the embodiment illustrated in FIG. 2, the handles 36a, 36b are outwardly biased by a spring element 40. However, it is contemplated that the handles 36a, 36b can be outwardly biased by other mechanisms or not biased at all. The levers 30a, 30b can be made either partially or entirely from a non-conductive material(s) so as to mitigate the risk of electrical shock to a user.

The probe 18 is positioned in one of the notches 38a formed in one of the jaws 34a. More particularly, the probe 18 extends from the jaw 34a into the space formed by the notch 38a. The probe 18 is configured to penetrate an insulation layer and electrically couple to a conductor of a wire of an LED light string. For example, the probe 18 can be made of a conductive material and have a generally pin shape with a pointed tip at the end extending into the space of the notch 38a. Additionally, the probe 18 can have a diameter or other cross-sectional dimensions that are sufficiently small so as to prevent or substantially inhibit any damage to the insulation of the LED light string and sufficiently large so as to withstand repeated couplings with an LED light string. As one non-limiting example, the probe 18 can have a diameter of approximately 0.025 inches (i.e., approximately 0.635 millimeters).

In the embodiment illustrated in FIG. 2, the polarity selector switch 16 is positioned on an exterior surface of one of the levers 30a. However, it is contemplated that according to other embodiments, the polarity selector switch 16 can be disposed within one of the levers 30a, 30b. The polarity selector switch 16 can be any mechanical or electronic component suitable to close and open a circuit between the outputs of the power conversion module 14 and the probe 18. Non-limiting examples of suitable switches include a toggle switch, a rocker switch, a pushbutton switch, a momentary switch, a slide switch, a biased switch, a latching switch, a non-latching switch, a relay, or the like. The polarity selector switch 16 shown in FIG. 2 is a momentary toggle switch having a positive position corresponding to the positive closed state, a center-off position corresponding to the open state, and a negative position corresponding to the negative closed state. The polarity selector switch 16 can be biased (e.g., by a spring) to the center-off position.

The diagnostic device 10 further includes a plug housing 42. The plug housing 42 includes the hot contact 20a and the neutral contact 20b of the plug 12. Additionally, the power conversion module 14 is disposed within the plug housing 42. It is contemplated that, according to other embodiments, the power conversion module 14 can be disposed within one of the levers 30a, 30b of the diagnostic device or in a separate housing mounted to one of the levers 30a, 30b of the diagnostic device 10.

Figure 3A:
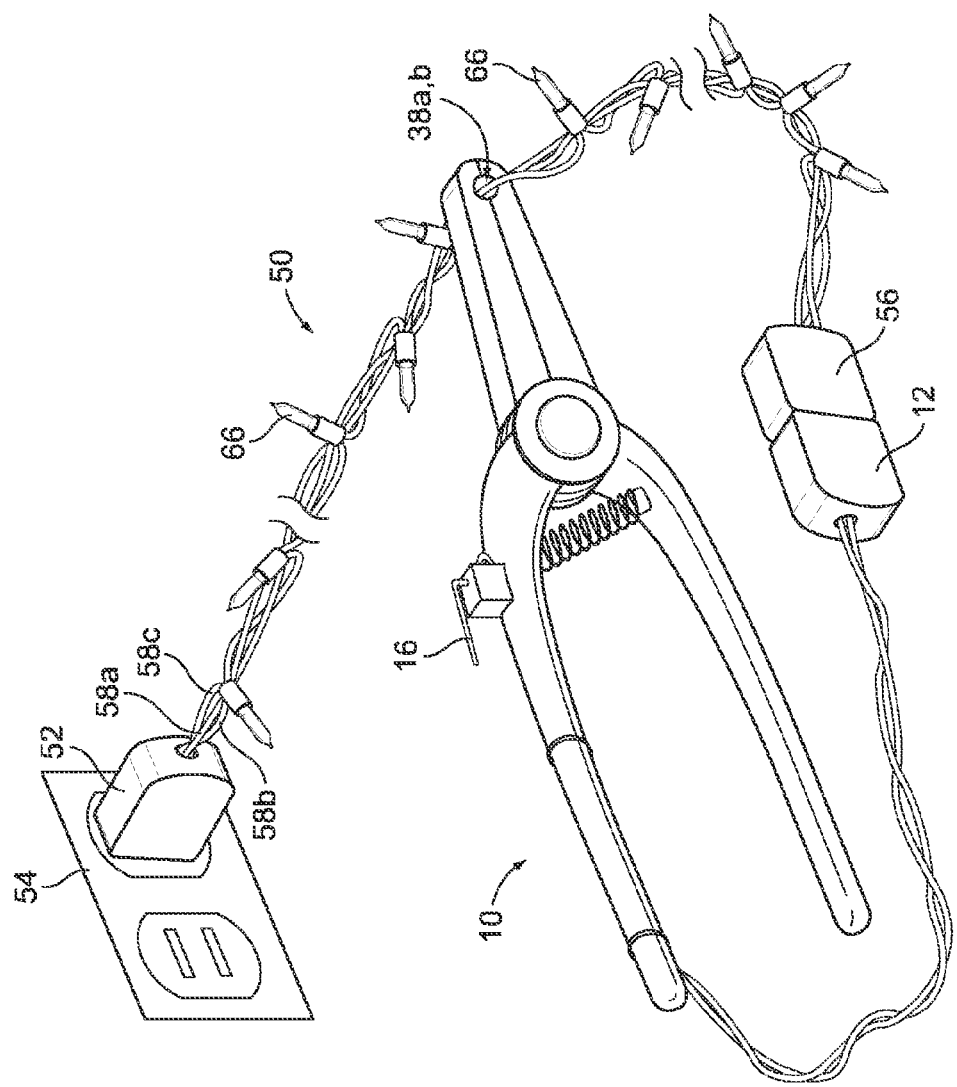
FIG. 3A is an illustration of the diagnostic device of FIG. 2 coupled to a decorative LED light string with a polarity selector switch in a center-off position.
Figure 3B:
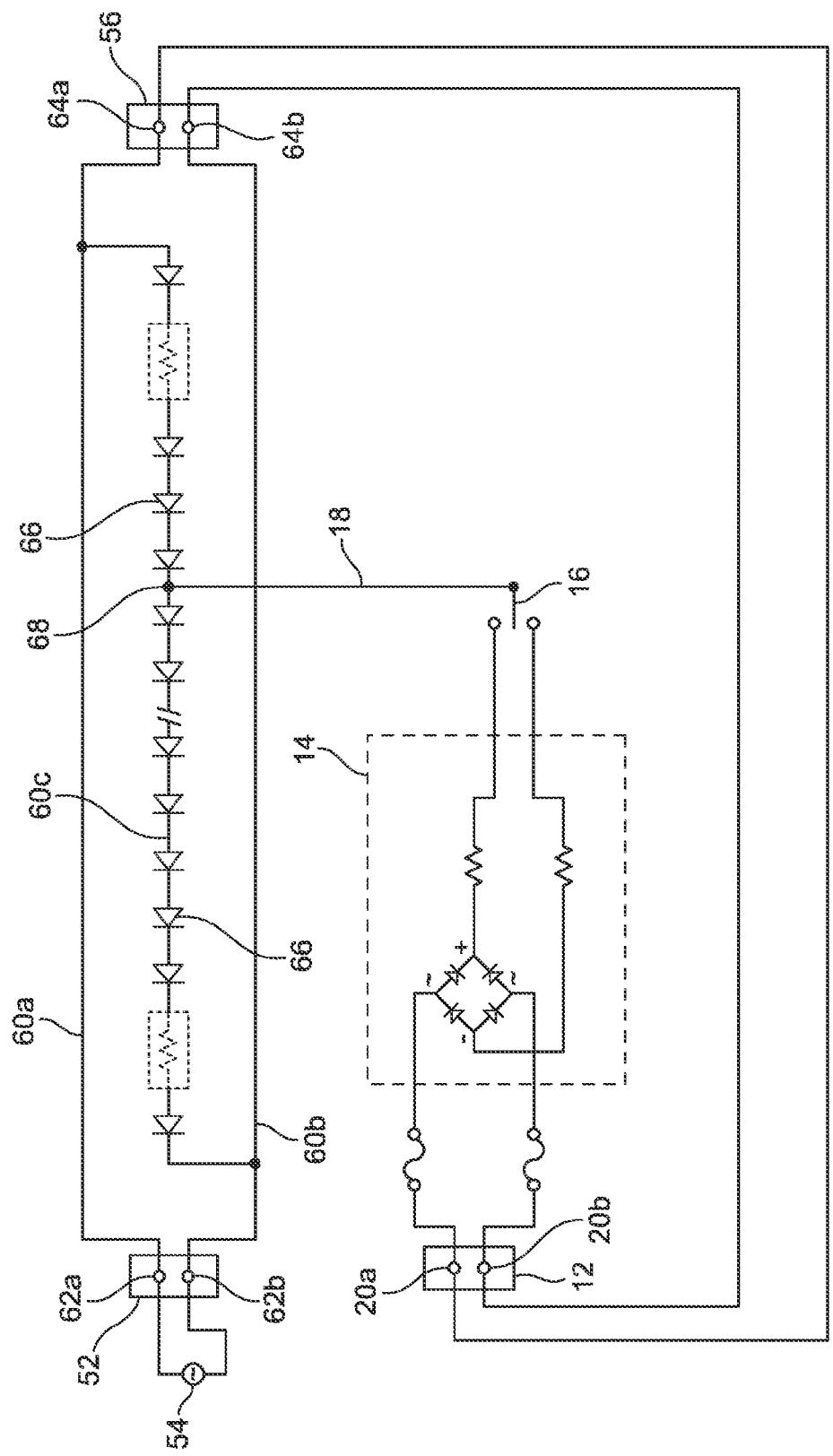
FIG. 3B is a circuit diagram of the diagnostic device and decorative LED light string illustrated in FIG. 3A.

FIG. 3A shows the diagnostic device 10 being coupled to an exemplary LED light string 50 to identify a defect in the LED light string 50. FIG. 3B shows a circuit diagram corresponding to the diagnostic device 10 and the LED light string 50 shown in FIG. 3A. The LED light string 50 shown in FIGS. 3A and 3B, is a half-wave LED light string. As such, the LEDs would only illuminate on positive half-cycles of an AC electrical power source if no defects existed in the LED light string 50. The half-wave LED light string type is used herein for ease of illustration and description purposes only. It will be understood by those skilled in the art that the present concepts can be applied to other types of decorative LED light strings such as, for example, full-wave LED light strings, LED light strings having control modules with an all-on function, etc. Similarly, it will be understood by those skilled in the art that the light string 50 can have various alternative configurations such as, for example, a net configuration, a rope configuration, a cluster configuration, an icicle configuration, a curtain configuration, etc.

The LED light string 50 includes a plug 52 for receiving electrical power from an electrical power source 54 at a first end of the LED light string 50 and an electrical socket 56 for providing electrical power to another electrical device (e.g., the diagnostic device 10) at a second end of the LED light string 50. The LED light string 50 further includes a first wire 58a having a first conductor 60a within a layer of insulation, a second wire 58b having a second conductor 60b within a layer of insulation, and a third wire 58c having a third conductor 60c within a layer of insulation. The first conductor 60a is electrically coupled to a supply contact 62a of the plug 52 at the first end of the LED light string 50 and a supply contact 64a of the socket 56 at the second end of the LED light string 50. The second conductor 60b is electrically coupled to a return contact 62b of the plug 52 at the first end of the LED light string 50 and a return contact 64b of the socket 56 at the second end of the LED light string 50. The third conductor 60c includes a plurality of LEDs 66 connected in series between the first conductor 60a and the second conductor 60b.

To identify a defect in the LED light string 50, the diagnostic device 10 and the LED light string 50 are coupled to a common electrical power source 54 (i.e., the same electrical power source 54). For example, as shown in FIGS. 3A and 3B, the plug 52 of the LED light string 50 is coupled to a socket of an electrical power source 54 (e.g., a standard AC outlet) and the plug 12 of the diagnostic device 10 is coupled to the socket 56 of the LED light string 50. It will be understood by those skilled in the art that there are other ways to electrically couple the diagnostic device 10 and the LED light string 50 to a common power source 54. For example, the plug 12 of the diagnostic device 10 also can be coupled to another socket of the electrical power source 54 instead of the socket 56 of the LED light string 50.

Once the LED light string 50 and the diagnostic device 10 have been connected to the electrical power source 54, the probe 18 of the diagnostic device 10 is coupled to the third conductor 60c of the LED light string 50 at a first testing location 68. For example, in FIG. 3A, the third wire 58c of the LED light string 50 is positioned between the notches 38a, 38b of the diagnostic device 10 and the jaws 34a, 34b are closed by actuating the handles 36a, 36b. As the jaws 34a, 34b close, the probe 18 penetrates through the insulation and contacts the third conductor 60c of the third wire 58c.

Although the LED light string 50 and the diagnostic device 10 are coupled to the electrical power source 54 in FIG. 3A, the LEDs 66 are not illuminated when there is a defect (i.e., an open circuit condition) along the third wire 58c because there is no complete path from the supply contact 62a of the light string plug 52 through the LEDs 66 to the return contact 62a of the light string plug 52. In other words, because the LEDs 66 are connected in series and an open circuit condition exists on the third conductor 60c, the LEDs 66 are not illuminated as no current can flow through the LEDs 66. Also, because the polarity selector switch 16 is in the center-off position in FIG. 3A (corresponding to the open state in FIG. 3B), no current flows to the LEDs 66 of the third conductor 60c via the probe 18 of the diagnostic device 10.

Figure 4A:
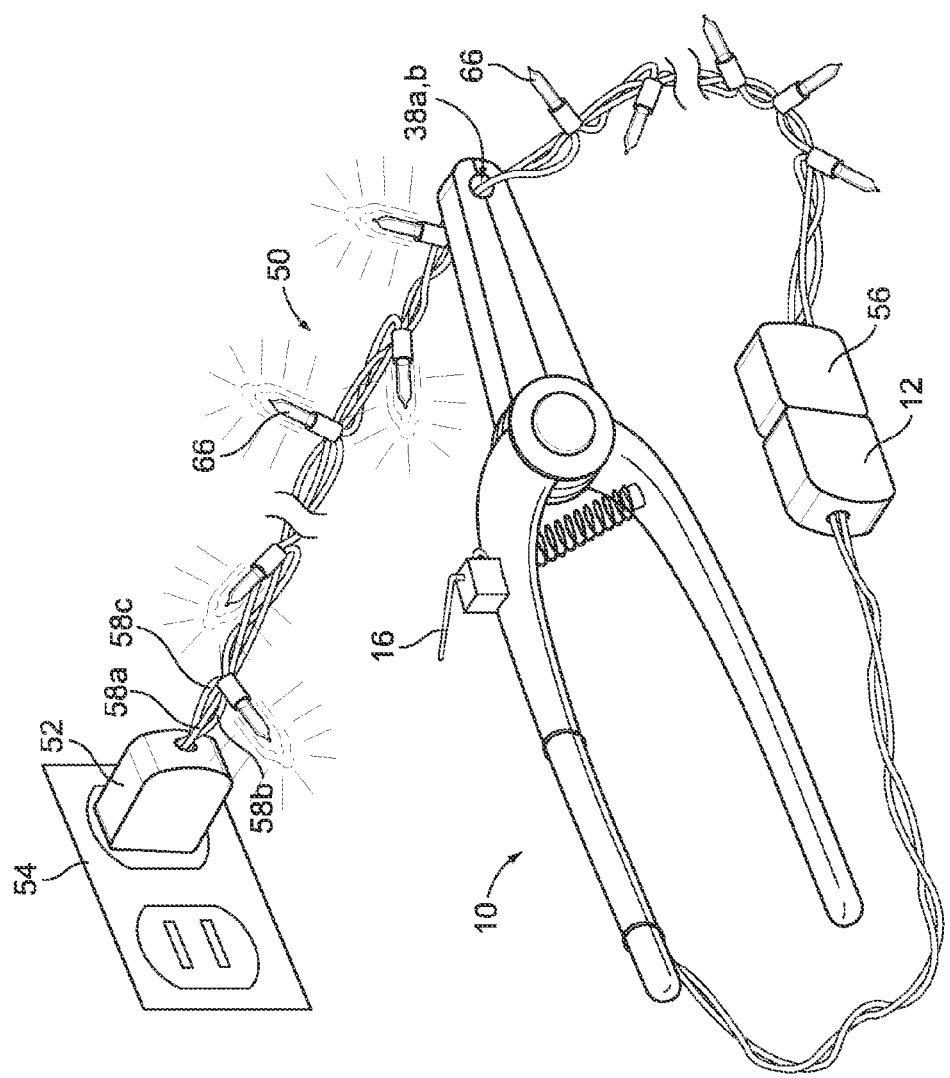
FIG. 4A is an illustration of the diagnostic device of FIG. 2 coupled to a decorative LED light string with a polarity selector switch in a positive position.
Figure 4B:
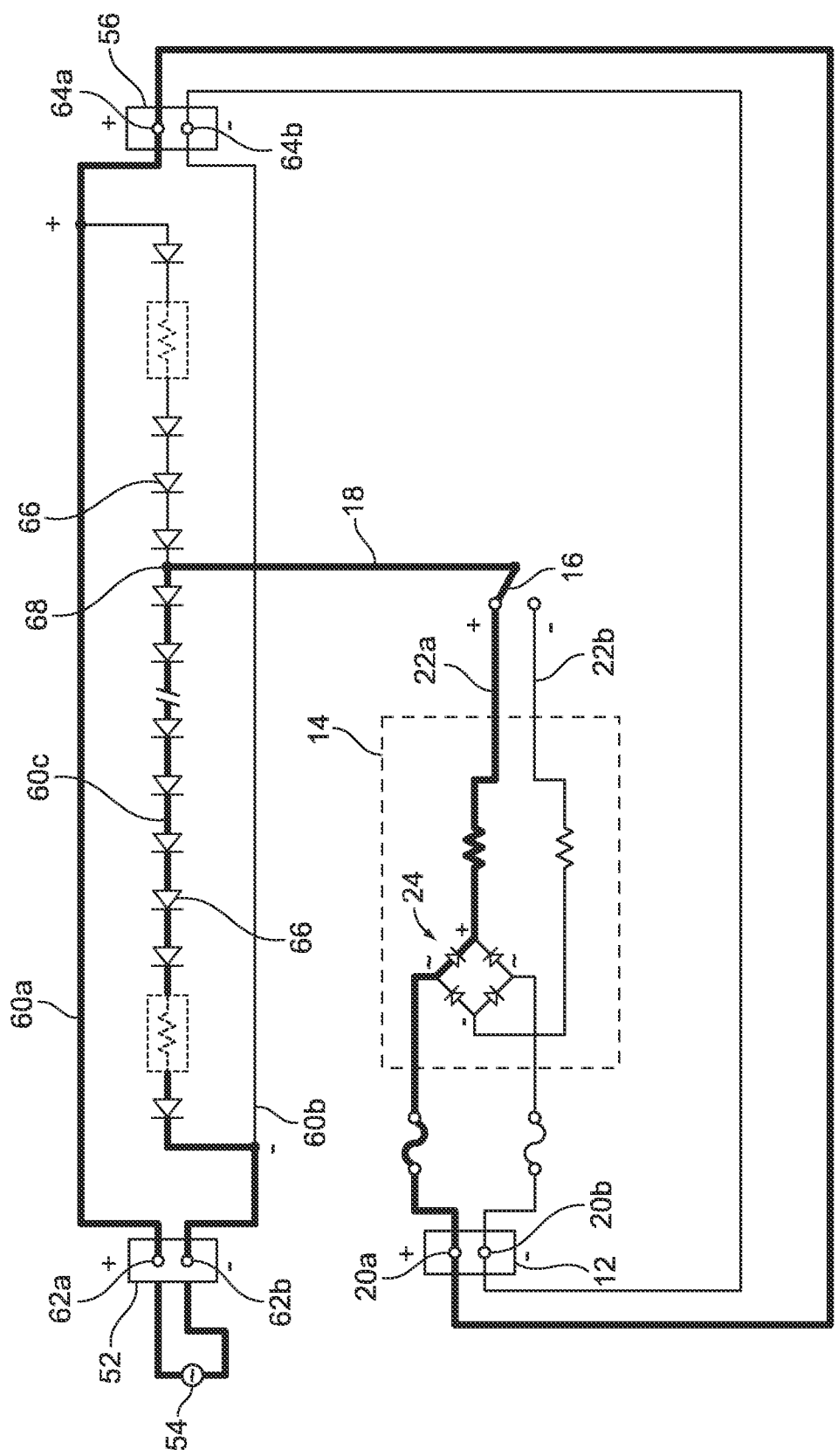
FIG. 4B is a circuit diagram of the diagnostic device and decorative LED light string illustrated in FIG. 4A.

FIGS. 4A and 4B show the diagnostic device 10 coupled to the LED light string 50 and a corresponding circuit diagram with the polarity selector switch 16 in the positive position. As shown in FIG. 4B, with the polarity selector switch 16 in the positive position (corresponding to the positive closed state), the probe 18 is electrically coupled to the positive output 22a of the power conversion module 14 and a positive full-wave rectified waveform is provided to the probe 18.

Assuming the defect is located to the right (i.e., towards the light string socket 56) of the first testing location 68 (i.e., the location on the third conductor 60c where the probe 18 is coupled), a closed loop is formed as indicated by the bold line in FIG. 4B for a positive half-wave cycle of the AC electrical power source 54. Using a conventional model of current flow (i.e., current flows from positive electrical potential to negative electrical potential), during a positive half-wave cycle of the electrical power source 54, current flows through the resulting closed loop as follows. From the electrical power source 54, the current flows to the supply contact 62a of the light string plug 52 and along the first conductor 60a to the supply contact 64a of the light string socket 56. From the supply contact 64a of the light string socket 56, the current flows to the hot contact 20a of the diagnostic device plug 12 and through the diode bridge 24 to the positive output 22a of the power conversion module 14. From the positive output 22a of the power conversion module 14, the current flows through the polarity selector switch 16 to the probe 18. The current then flows from the probe 18, through the LEDs 66 along the third conductor 60c to the second conductor 60b, to the return contact 62b of the light string plug 52 and the electrical power source 54.

Accordingly, when the polarity selector switch 16 is in the positive position and the defect is to the right of the first testing location 68, current flows through the LEDs 66 to the left (i.e., towards the light string plug 52) of the first testing location 68 and those LEDs 66 are illuminated, as shown in FIG. 4A. However, when the polarity selector switch 16 is in the positive position and the defect is located to the left of the first testing location 68, there is no closed loop because the defect creates an open circuit condition that prevents current from flowing from the probe 18 to the second conductor 60b (and, thus, the return contact 62b of the light string plug 52). Thus, if the LEDs 66 to the left of the first testing location 68 are illuminated when the polarity selector switch 16 is in the positive position, it can be determined that the defect is located to the right of the first testing location 68.

Regardless of where the defect is located on the third wire 58c, the LEDs 66 to the right of the first testing location 68 will not be illuminated when the polarity selector switch 16 is in the positive position due to the defect on the third conductor 60c and the positive full-wave rectified waveform at the junction 68 between the probe 18 and the third conductor 60c.

Figure 5A:
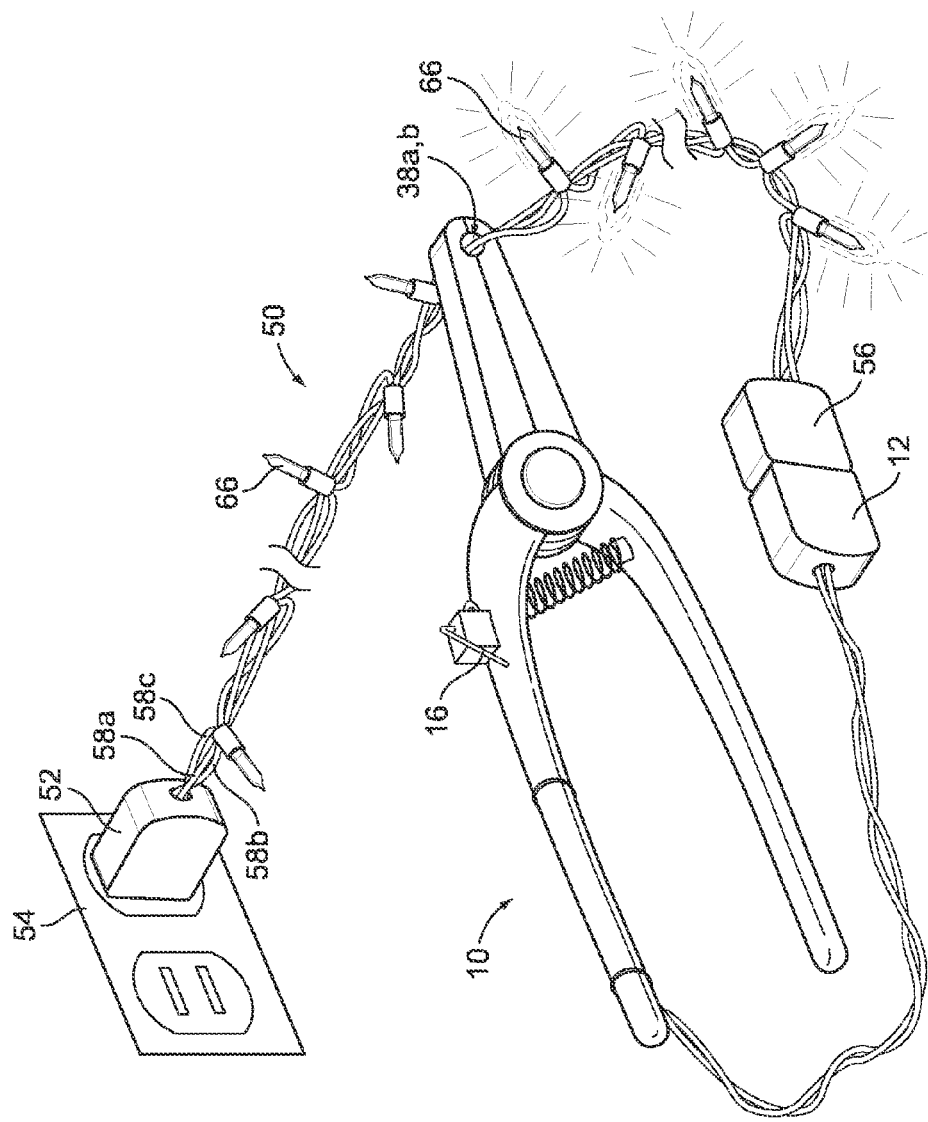
FIG. 5A is an illustration of the diagnostic device of FIG. 2 coupled to a decorative LED light string with a polarity selector switch in a negative position.
Figure 5B:
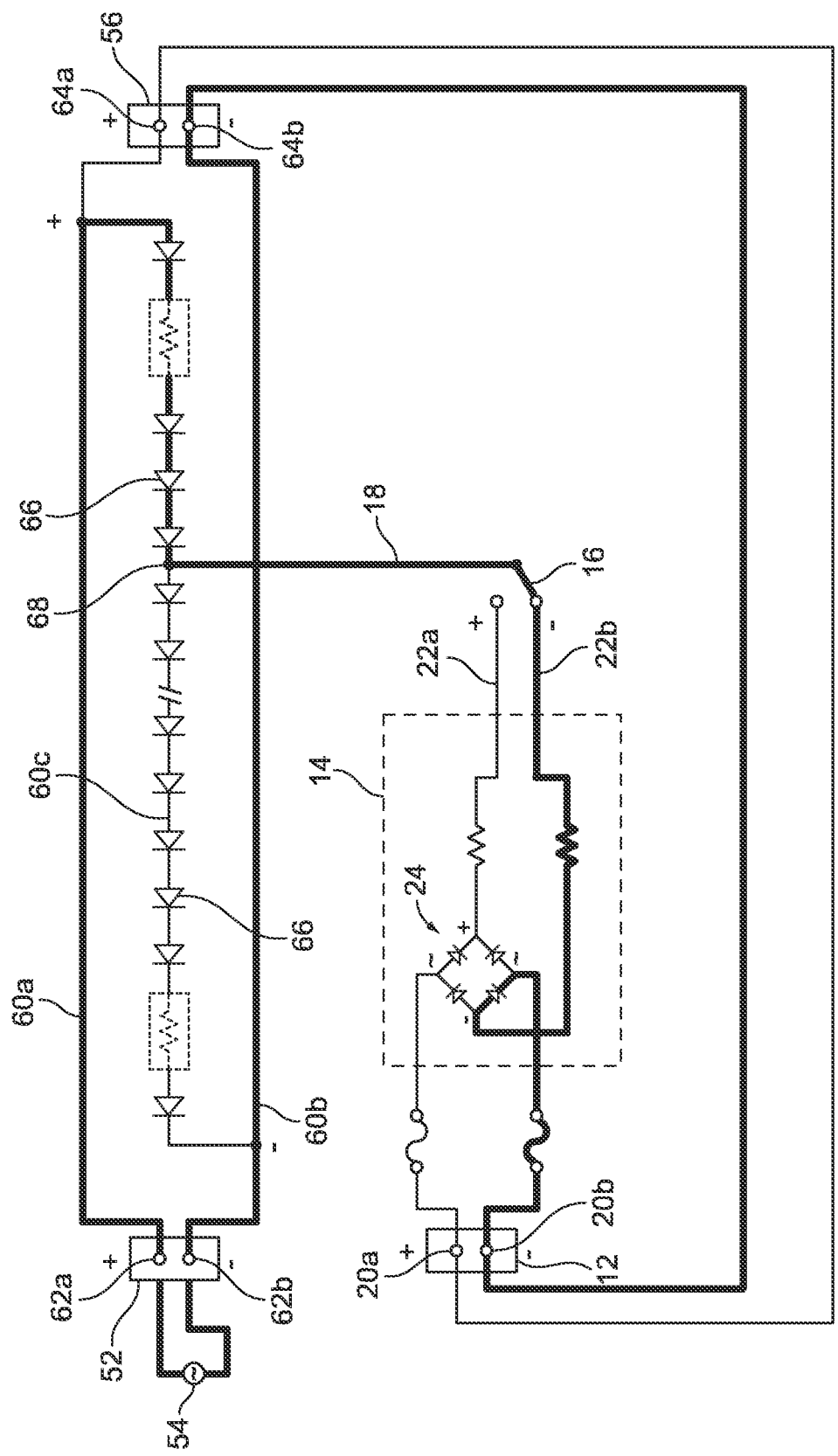
FIG. 5B is a circuit diagram of the diagnostic device and decorative LED light string illustrated in FIG. 5A.

FIGS. 5A and 5B show the diagnostic device 10 coupled to the LED light string 50 and a corresponding circuit diagram with the polarity selector switch 16 in the negative position. As shown in FIG. 5B, with the polarity selector switch 16 in the negative position (corresponding to the negative closed state), the probe 18 is electrically coupled to the negative output 22b of the power conversion module 14 and a negative full-wave rectified waveform is provided to the probe 18.

Assuming the defect is located to the left of the first test location 68, a closed loop is formed as indicated by the bold line in FIG. 5B for a positive half-wave cycle of the AC electrical power source 54. Using the conventional model of current flow, during a positive half-wave cycle of the electrical power source 54, current flows through the resulting closed loop as follows. From the electrical power source 54, the current flows to the supply contact 62a of the light string plug 52 and along the first conductor 60a to the junction of the first conductor 60a and the third conductor 60c. The current flows from the first conductor 60a through the third conductor 60c to the probe 18. From the probe 18, the current flows to the negative output 22b of the power conversion module 14 through the diode bridge 24 to the neutral contact 20b of the diagnostic device plug 12. From the neutral contact 20b of the diagnostic device plug 12, the current flows to the return contact 64b of the light string socket 56 and then along the second conductor 60b to the return contact 62b of the light string plug 52 and the electrical power source 54.

Accordingly, when the polarity selector switch 16 is in the negative position and the defect is to the left of the first testing location 68, current flows through the LEDs 66 to the right of the first testing location 68 and those LEDs 66 are illuminated, as shown in FIG. 5A. However, when the polarity selector switch 16 is in the negative position and the defect is located to the right of the first testing location 68, there is no closed loop because the defect creates an open circuit condition that prevents current from flowing from the first conductor 60a to the probe 18. Thus, if the LEDs 66 to the right of the first testing location 68 are illuminated when the polarity selector switch 16 is in the negative position, it can be determined that the defect is located to the left of the first testing location 68.

Regardless of where the defect is located on the third wire 58c, the LEDs 66 to the left of the first testing location 68 will not be illuminated when the polarity selector switch 16 is in the negative position due to the defect on the third conductor 60c and the negative full-wave rectified waveform at the junction 68 between the probe 18 and the third conductor 60c.

As demonstrated by FIGS. 4A-5B, the polarity selector switch 16 controls the polarity of the full-wave rectified waveform provided to probe 18 so that current is supplied to the portion of the LED light string 50 on one side of the probe 18 when the switch 16 is in the positive position and to the portion of the LED light string 50 on the other side of the probe 18 when the switch 16 is in the negative position. The portion of the LED light string 50 having the defect is thus identified as the portion of the LED light string 50 that was not illuminated after the polarity selector switch 16 was moved to the positive position and the negative position. The defect can be precisely and efficiently located by coupling the diagnostic device 10 to successive testing locations along the non-illuminated portion of the LED light string 50 and repeating the process.

Figure 6:
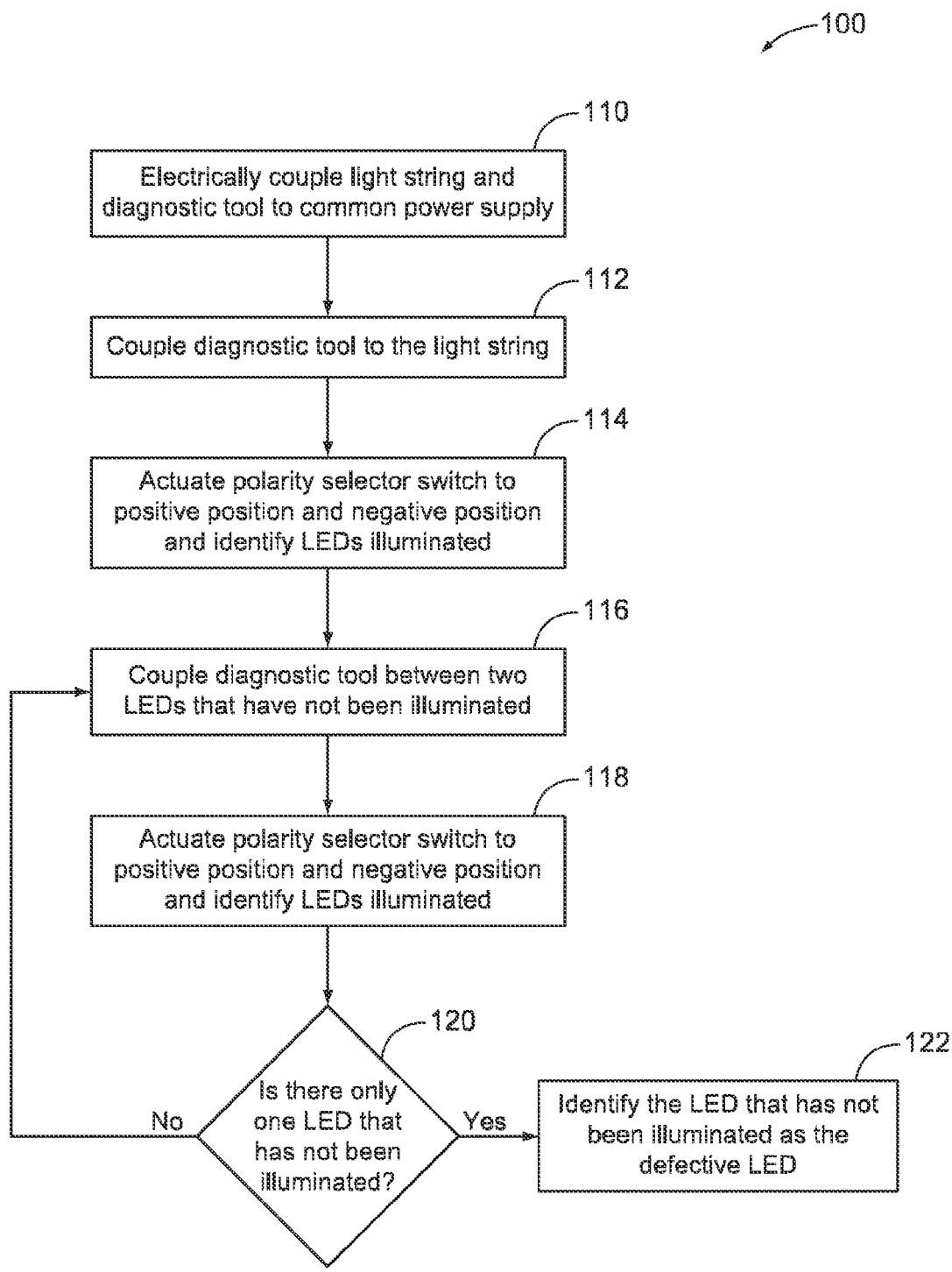
FIG. 6 is a flowchart of a process for identifying a defective LED in a decorative LED light string according to some aspects of the present invention.

For example, referring to FIG. 6, a flowchart for a process 100 of identifying a defective LED 66 in the LED light string 50 is illustrated. At block 110, the LED light string 50 and the diagnostic device 10 are electrically coupled to the common electrical power source 54. At block 112, the probe 18 of the diagnostic device 10 is electrically coupled to the third conductor 60c of the LED light string 50 between two LEDs 66. At block 114, the polarity selector switch 16 is moved to the positive position and the negative position. Additionally, at block 114, the LEDs 66 that are illuminated in response to the polarity selector switch 16 being in the positive position and the negative position are identified. At block 116, the diagnostic device 10 is coupled to the third conductor 60c between two LEDs 66 that have not been illuminated during the process 100. At block 118, the polarity selector switch 16 is moved to the positive position and the negative position and the LEDs 66 that are illuminated are identified. At decision block 120, it is determined whether there is only one LED 66 that has not been previously illuminated during the process 100. If it is determined that more than one LED 66 has not been previously illuminated, the process 100 returns to block 116. If it is determined that only one LED 66 has not been previously illuminated at block 120, then that LED 66 is identified as the defective LED at block 122.

Accordingly, the diagnostic device 10 allows for significantly more efficient and rapid identification of a defect in an LED light string 50 than previously possible. To further optimize the efficiency of the defect identification process 100, it is contemplated that the first testing location can be at the midpoint of the LED light string 50 and each successive testing location can be at a midpoint of each successive non-illuminated portion of the LED light string 50. Additionally, to aid a user in the identification of LEDs that were illuminated during the defect identification process 100, it is contemplated that markers such as, for example, a clip can be placed at one or more of the testing locations along the LED light string 50 during the process 100.

Once the defect is identified, the defect can be repaired. Some LED light strings 50 have replaceable LEDs. In replaceable LED light strings, the defective LED is removed and a replacement LED is connected to the light string in its place. If, however, there are no replacement LEDs available or the LED light string has non-replaceable LEDs, the defective LED can be cut out from the third conductor 60c of the LED light string 50 and the cut ends of the third conductor 60c directly or indirectly coupled to each other. When the cut ends of the third conductor 60c are directly coupled to each other, the magnitude of the current flowing through the remaining LEDs 66 increases because the removal of the defective LED lowers the total resistance of the LED light string 50. Because the magnitude of current flowing through the remaining LEDs 66 is increased, the lifespan of the remaining LEDs 66 will be reduced.

Figure 7A:
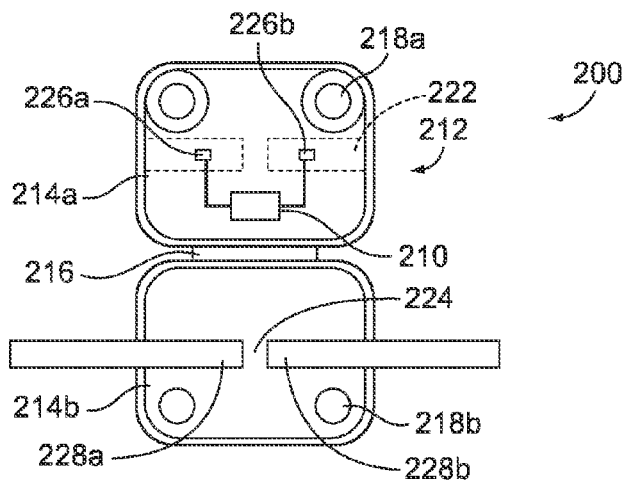
FIGS. 7A-7E illustrate an exemplary repair device for repairing a decorative LED light string having a defective LED according to some aspects of the present invention.
Figure 7B:
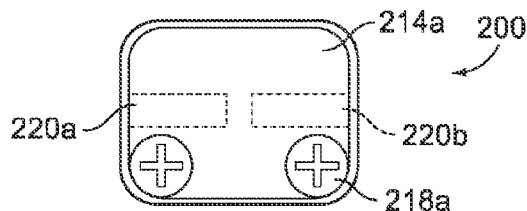
Figure 7C:
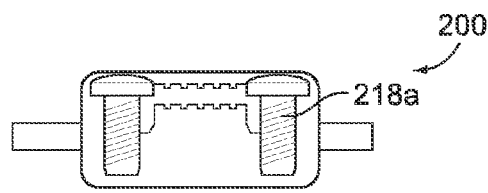
Figure 7D:
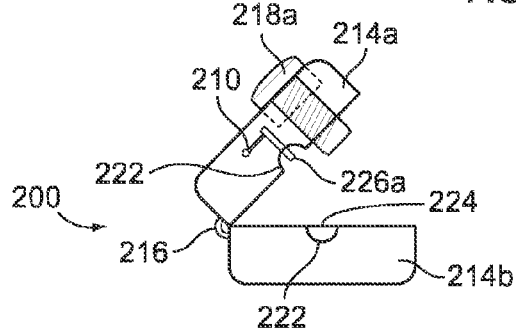
Figure 7E:
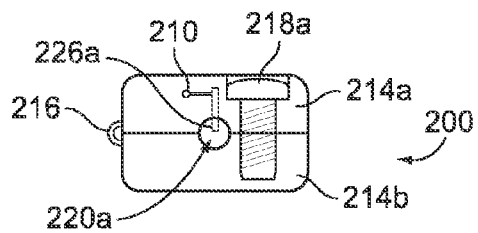

FIGS. 7A-7E illustrate a repair device 200 that addresses such problems by coupling a resistor 210 between the cut ends of the third conductor 60c. The repair device 200 includes a housing 212 made entirely or at least partially from a non-conductive material. The housing 212 has a top portion 214a and a bottom portion 214b. In the illustrated embodiment, the top portion 214a of the housing 212 is hingedly coupled to the bottom portion 214b by, for example, a living hinge 216. The hinge 216 facilitates opening and closing of the top portion 214a and the bottom portion 214b of the housing 212. FIG. 7A shows the repair device 200 in an open position and FIGS. 7B, 7C, and 7E show the repair device 200 in a closed position. To secure the top portion 214a to the bottom portion 214b in the closed position, the top portion 214a and the bottom portion 214b include corresponding securement features. For example, the top portion 214a can include captive self-threading screws 218a and the bottom portion 214b can include corresponding threaded bores 218b. It is contemplated that any other suitable attachment features can be provided such as, for example, screws, bolts, latches, clamps, or the like. Additionally, it is contemplated that, according to other embodiments, the top portion 214a can be separate from the bottom portion 214b.

The top portion 214a and the bottom portion 214b are configured to form a first wire-receiving cavity 220a and a second wire-receiving cavity 220b when the top portion 214a and the bottom portion 214b are in the closed position (see FIGS. 7B and 7E). For example, the top portion 214a and the bottom portion 214b can include recessed surfaces 222 separated by a stop 224 on opposing sides of the top portion 214a and the bottom portion 214b. As such, when the top portion 214a and the bottom portion 214b are coupled in the closed position, the first wire-receiving cavity 220a extends from a first side of the housing 212 to the stop 224 and the second wire-receiving cavity 220b extends from a second, opposing side of the housing 212 to the stop 224. The stop 224 assists in inserting wires into the first wire-receiving cavity 220a and the second wire-receiving cavity 220b without directly coupling the inserted wires to each other.

The resistor 210 is coupled to or disposed in the top portion 214a of the housing 212. According to other embodiments, it is contemplated that the resistor 210 can be coupled to or disposed in the bottom portion 214b of the housing 212. The resistor 210 is coupled to a first wire-piercing element 226a on one side and a second wire-piercing element 226b on the other side. The first wire-piercing element 226a and the second wire-piercing element 226b are configured to penetrate an insulation layer of a wire and electrically couple to a conductor within the insulation layer. For example, the first wire-piercing element 226a and the second wire-piercing element 226b can be made of a conductive material and have a generally pin shape with a pointed tip extending into the first wire-receiving cavity 220a and the second wire-receiving cavity 220b when in the closed position, as shown in FIGS. 7D-7E.

The repair device 200 can be coupled to the LED light string 50 as follows. When the third conductor 60c is cut to remove a defective LED, a first cut end 228a and a second cut end 228b are formed in the third conductor 60c. With the repair device 200 in the open position, the first cut end 228a and the second cut end 228b of the third conductor 60c are received in the opposing recessed surfaces 222 of the bottom portion 214b of the repair device 200, as shown in FIG. 7A. To ensure that the first cut end 228a and the second cut end 228b will be sufficiently inserted in the wire-receiving cavities 220a, 220b when the repair device 200 is closed, the first cut end 228a and the second cut end 228b can be received in the recessed surfaces 222 of the bottom portion 214b such that the first cut end 228a and the second cut end 228b abut the stop 224. The top portion 214a is closed and secured to the bottom portion 214b by the securement features 218a, 218b. As the repair device 200 is closed, the first wire-piercing element 226a penetrates the insulation at or adjacent to the first cut end 228a and the second wire-piercing element 226b penetrates the insulation at or adjacent to the second cut end 228b. The first wire-piercing element 226a electrically couples to the third conductor 60c at or adjacent to the first cut end 228a and the second wire-piercing element 226b electrically couples to the third conductor 60c at or adjacent to the second cut end 228b. As a result, the first cut end 228a of the third conductor 60c is electrically coupled to the second cut end 228b of the third conductor 60c by the resistor 210.

The resistor 210 can have any suitable value for limiting the current passing through the third conductor 60c. For example, the resistor 210 can be a quarter of a Watt resistor.

It is contemplated that, according to some embodiments, the resistor 210 can have a resistance value that is approximately equivalent to the effective resistance value of the defective LED that was removed from the third conductor 60c. Because a resistance is provided between the first cut end 228a and the second cut end 228b, the current passing through the remaining LEDs 66 can be maintained at an appropriate level that does not prematurely burn out the remaining LEDs 66 or lead to other undesirable issues. Additionally, the repair device 200 is advantageous even for replaceable LED light strings in that the user need not look for replacement LEDs 66.

It is contemplated that according to alternative embodiments, an LED can be coupled to or disposed in the housing 212 instead of a resistor 210 (e.g., as described below with respect to FIGS. 10A-E). Additionally, it is contemplated that according to alternative embodiments, the repair device 200 can be coupled to the third conductor 60c of an LED light string 50 without first cutting a defective LED out of the LED light string. For example, the repair device 200 can be configured to the LED light string 50 such that the resistor 210 of the repair device 200 is coupled in parallel with a defective LED (e.g., as described below with respect to FIGS. 9A-E).

Figure 8A:
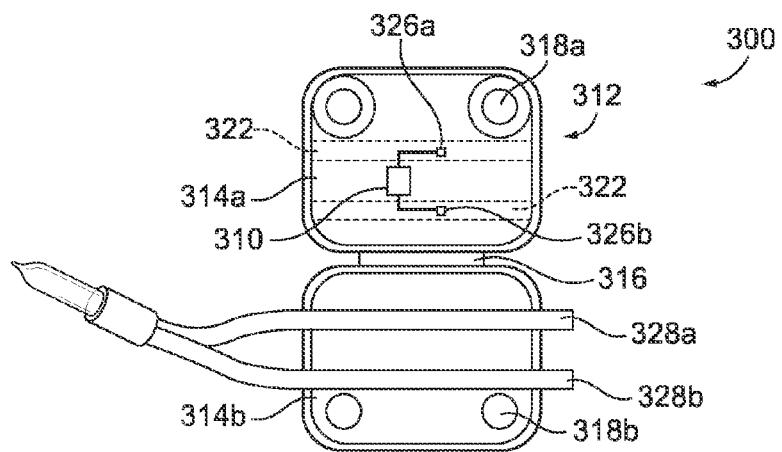
FIGS. 8A-8E illustrate another exemplary repair device for repairing a decorative LED light string having a defective LED according to some aspects of the present invention.
Figure 8B:
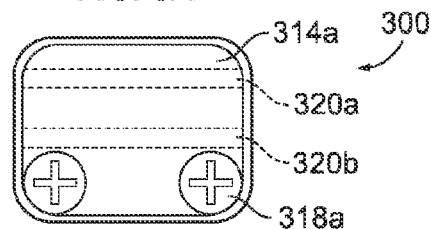
Figure 8C:
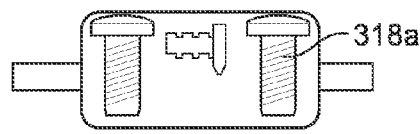
Figures 8D, 8E:
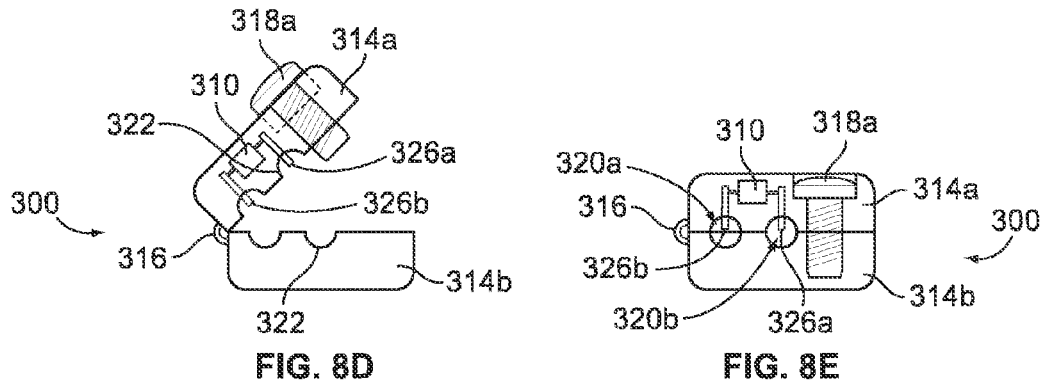

Referring now to FIGS. 8A-8E, another exemplary repair device 300 is shown. The repair device 300 is substantially similar to the repair device 200 illustrated in and described with respect to FIGS. 7A-7E, except the repair device 300 can be coupled to the third conductor 60c of an LED light string 50 without first cutting a defective LED out of the LED light string 50. The repair device 300 includes a housing 312 made entirely or at least partially from a non-conductive material. The housing 312 has a top portion 314a and a bottom portion 314b. In the illustrated embodiment, the top portion 314a of the housing 312 is hingedly coupled to the bottom portion 314b by, for example, a living hinge 316. The hinge 316 facilitates opening and closing of the top portion 314a and the bottom portion 314b of the housing 312. FIG. 8A shows the repair device 300 in an open position and FIGS. 8B, 8C, and 8E show the repair device 300 in a closed position. To secure the top portion 314a to the bottom portion 314b in the closed position, the top portion 314a and the bottom portion 314b include corresponding securement features. For example, the top portion 314a can include captive self-threading screws 318a and the bottom portion 314b can include corresponding threaded bores 318b. It is contemplated that any other suitable attachment features can be provided such as, for example, screws, bolts, latches, clamps, or the like. Additionally, it is contemplated that, according to other embodiments, the top portion 314a can be separate from the bottom portion 314b (i.e., without the hinge 316).

The top portion 314a and the bottom portion 314b are configured to form a first wire-receiving cavity 320a and a second wire-receiving cavity 320b when the top portion 314a and the bottom portion 314b are in the closed position (see FIGS. 8B and 8E). For example, the top portion 314a and the bottom portion 314b can include recessed surfaces 322 extending across inner surfaces of the top portion 314a and the bottom portion 314b. As such, when the top portion 314a and the bottom portion 314b are coupled in the closed position, the first wire-receiving cavity 320a and the second wire-receiving cavity 320b extend from a first side of the housing 312 to a second side, opposing side of the housing.

The resistor 310 is coupled to or disposed in the top portion 314a of the housing 312. According to other embodiments, it is contemplated that the resistor 310 can be coupled to or disposed in the bottom portion 314b of the housing 312. The resistor 310 is coupled to a first wire-piercing element 326a on one side and a second wire-piercing element 326b on the other side. The first wire-piercing element 326a and the second wire-piercing element 326b are configured to penetrate an insulation layer of a wire and electrically couple to a conductor within the insulation layer. For example, the first wire-piercing element 326a and the second wire-piercing element 326b can be made of a conductive material and have a generally pin shape with a pointed tip extending into the first wire-receiving cavity 320a and the second wire-receiving cavity 320b when in the closed position, as shown in FIGS. 8D-8E. However, it is contemplated that wire-piercing elements 326a, 326b can have any other suitable shape for penetrating the insulation layer of a wire and electrically coupling to the conductor within the insulation layer (e.g., fork, blade, etc.).

The repair device 300 can be coupled to the LED light string 50 as follows. As shown in FIG. 8A, the third wire 58c of the LED light string 50 includes a first portion 328a and a second portion 328b coupled on opposing sides of a defective LED 66a. With the repair device 300 in the open position, the first portion 328a and the second portion 328b are each received in a respective one of the recessed surfaces 322 of the bottom portion 314b of the repair device 300, as shown in FIG. 8A. The top portion 314a is closed and secured to the bottom portion 314b by the securement features 318a, 318b. As the repair device 300 is closed, the first wire-piercing element 326a penetrates the insulation of the first portion 328a and the second wire-piercing element 326b penetrates the insulation of the second portion 328b. The first wire-piercing element 326a electrically couples to the third conductor 60c of the first portion 328a and the second wire-piercing element 326b electrically couples to the third conductor 60c of the second portion 328b. As a result, the first portion 328a of the third conductor 60c is electrically coupled to the second portion 322b of the third conductor 60c by the resistor 310. In other words, the resistor 310 is coupled in parallel to the defective LED 66 to provide a bypass for electrical current to flow past the defective LED 66a. Significantly, the repair device 300 can thus be used to repair a defect in an LED light string 50 without having to cut out a defective LED. As described above, the resistor 310 can have any suitable value for limiting the current passing through the third conductor 60c. Because a resistance is provided between the first portion 328a and the second portion 328b, the current passing through the remaining LEDs 66 can be maintained at an appropriate level that does not prematurely burn out the remaining LEDs 66 or lead to other undesirable issues.

Referring now to FIGS. 9A-9E, yet another exemplary repair device 400 is shown. The repair device 400 is substantially similar to the repair device 200 illustrated in and described with respect to FIGS. 7A-7E, except the repair device 400 includes a replacement LED 410 instead of the resistor 210 included in the repair device 200. Accordingly, the repair device includes a housing 412 having a top portion 414a coupled to a bottom portion 414b by a hinge 416, securement features 418a and 418b, and a first wire-receiving cavity 420a and a second wire-receiving cavity 420b formed by a plurality of recessed surfaces 422 and separated by a stop 424, as described above for like features for the repair device 200.

As shown in FIGS. 9A-9E, the replacement LED 410 is coupled to or disposed in the top portion 414a of the repair device 400. In particular, the replacement LED 410 is coupled to or disposed in the top portion 414a of the housing 412 so as to be visibly exposed from the exterior of the repair device 400. For example, the top portion 414a can include an aperture through which the replacement LED 410 extends or is otherwise visible. According to other embodiments, it is contemplated that the replacement LED 410 can be coupled to or disposed in the bottom portion 414b of the housing 412.

Figure 9A:
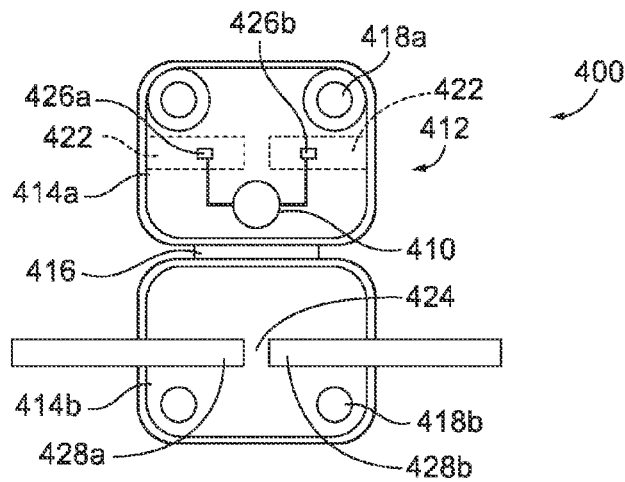
FIGS. 9A-9E illustrate another exemplary repair device for repairing a decorative LED light string having a defective LED according to some aspects of the present invention.
Figure 9B:
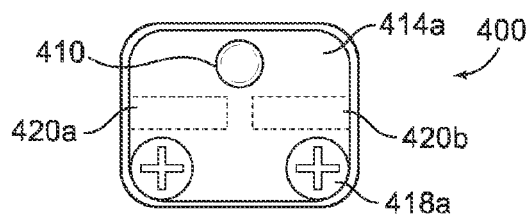
Figure 9C:
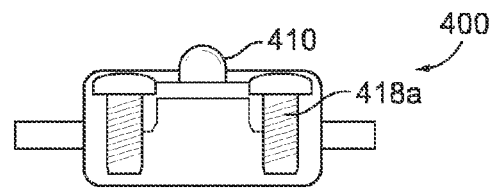
Figure 9D:
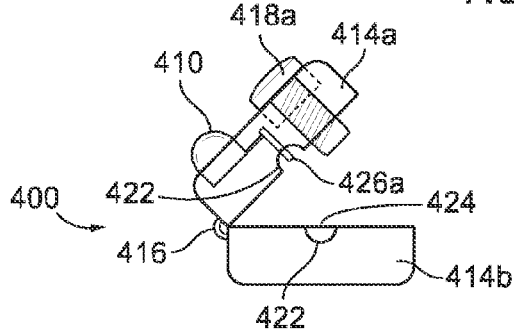
Figure 9E:
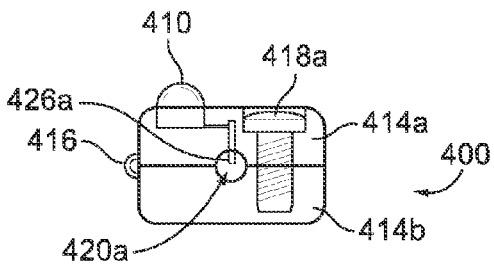

The replacement LED 410 is coupled to a first wire-piercing element 426a on one side and a second wire-piercing element 426b on the other side. The first wire-piercing element 426a and the second wire-piercing element 426b are configured to penetrate an insulation layer of a wire and electrically couple to a conductor within the insulation layer. For example, the first wire-piercing element 426a and the second wire-piercing element 426b can be made of a conductive material and have a generally pin shape with a pointed tip extending into the first wire-receiving cavity 420a and the second wire-receiving cavity 420b when in the closed position, as shown in FIGS. 9D-9E. However, it is contemplated that wire-piercing elements 426a, 426b can have any other suitable shape for penetrating the insulation layer of a wire and electrically coupling to the conductor within the insulation layer (e.g., fork, blade, etc.).

The repair device 400 can be coupled to the LED light string 50 as described above with respect to the repair device 200 so that the first cut end 428a of the third conductor 60c is electrically coupled to the second cut end 428b of the third conductor 60c by the replacement LED 410. As such, when current is provided to the third conductor 60c, the replacement LED 410 will be visibly illuminated along with the remaining LEDs 66 of the LED light string 50. Accordingly, the repair device 400 advantageously repairs a defect in an LED light string 50 without forming a noticeably large gap between the LEDs 66 of the repaired LED light string 50.

Because some replacement LEDs 410 will only illuminate with the correct electrical polarity provided to the replacement LED 410, the repair device 400 can optionally include a polarity indicia to ensure that the cut ends 428a, 428b are inserted in the correct wire-receiving cavity 420a, 420b. For example, the polarity indicia can indicate to which side of the repair device 400 the light string plug and the light string socket should be, or the polarity indicia can correspond to indicia on a diagnostic device to provide an indication of polarity. Alternatively, a dual polarity replacement LED, which illuminates with both positive and negative polarity, can be used to mitigate orientation issues. It is also contemplated that the repair device 300 illustrated and described with respect to FIGS. 8A-8E can similarly include a replacement LED instead of the resistor 310.

Referring now to FIGS. 10A-10F, another exemplary diagnostic device 500 for implementing a diagnostic device circuit (e.g., the diagnostic device circuit 8 illustrated in FIG. 1) is shown. The diagnostic device 500 includes a portable, hand-held housing 510 having a light-string-receiving portion 512. The light-string-receiving portion 512 is defined by a cutout space within the housing 510 that is configured to receive a wire of an LED light string (e.g., the LED light string 50), as will be described in detail below. The housing 510 can be made partially or entirely from a non-conductive material(s) so as to mitigate the risk of electrical shock to a user.

Figures 10A, 10B, 10C:
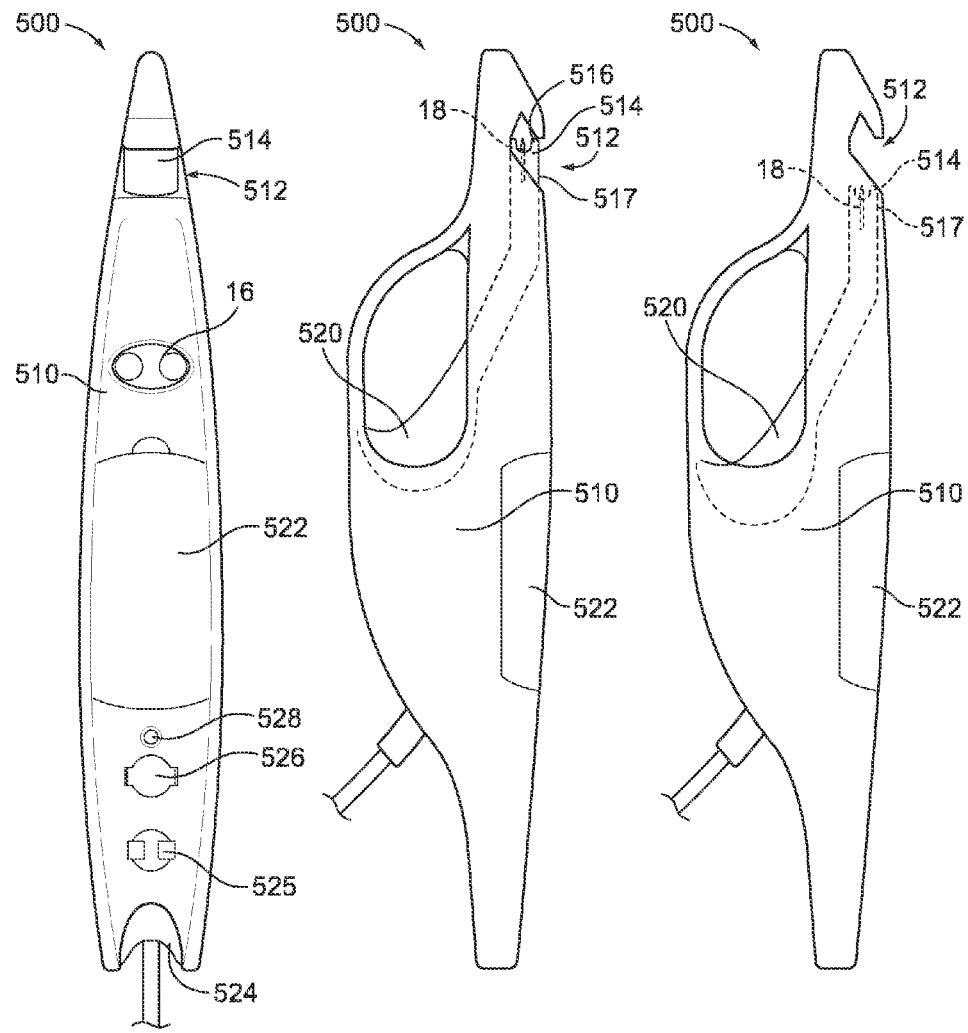
FIG. 10A is an illustration of a top view of another exemplary diagnostic device according to aspects of the present invention.
FIG. 10B is an illustration of a side view of the diagnostic device illustrated in FIG. 10A with a door in a closed position.
FIG. 10C is an illustration of a side view of the diagnostic device illustrated in FIG. 10A with a door in an open position.

The diagnostic device 500 further includes a door 514 disposed within the light-string-receiving portion 512 of the housing 510. The door 514 is configured to move between a closed position and an open position. As shown in FIG. 10B, when the door 514 is in the closed position, the door 514 inhibits or prevents access to the light-string-receiving portion 512. As shown in FIG. 10C, when the door 514 is in the open position, access to the light-string-receiving portion 512 is provided. A front end 516 of the door 514 has a generally curved or concave profile configured to receive the wire 58c of the LED light string 50, as will be explained in detail below.

The door 514 is operatively connected to a trigger 520 such that when the trigger 520 is actuated from a first position (as shown in FIG. 10B) to a second position (as shown in FIG. 10C), the door 514 moves from the closed position to the open position. In the embodiment illustrated in FIGS. 10A-10F, the door 514 is integrally formed with the trigger 520; however, according to other aspects, it is contemplated that the door 514 can be operatively connected to the trigger 520 in other ways such as, for example, by one or more separate components. The trigger 520 can be biased towards the first position so as to correspondingly bias the door 514 to the closed position. For example, the trigger 520 can be biased by a spring member (not shown) towards the first position. While actuation of the trigger 520 causes the door 514 to move from the closed position to the open position in the embodiment illustrated in FIGS. 10A-10F, it is contemplated that, according to other aspects, actuation of the trigger 520 can cause the door 514 to move from the open position to the closed position (e.g., as illustrated and described below with respect to FIGS. 11A-11C and FIGS. 15A-15C).

The probe 18 is positioned within the door 514 so as to partially extend into a space defined by the generally curved or concave surface of the front end 516 of the door 514. As explained above with respect to FIG. 2, the probe 18 is configured to penetrate an insulation layer and electrically couple to a conductor of a wire 58c of an LED light string 50. Advantageously, a portion of the top surface 517 and/or the front end 516 of the door 514 can extend beyond a tip of the probe 18 to protect a user from accidental injury on the pointed tip of the probe 18 when the door 514 moved between the closed position and the open position. Additionally, to further mitigate the risk of injury to the user due to the pointed tip of the probe 18, the front end 516 of the door 514 and the probe 18 can extend into a cavity of the housing 510 when the door 514 is in the closed position (as shown in FIG. 10B), and the front end 516 of the door 514 and the probe 18 can be retracted within the housing 510 when the door 514 is in the open position (as shown in FIGS. 10C and 10D).

In other words, the diagnostic device 500 can include safety features to inhibit or prevent the risk of injury by minimizing the exposure of the probe 18 within the light-string-receiving portion 512. It is contemplated that, according to other embodiments, the diagnostic device 500 can include other safety features such as, for example, a probe 18 that is retractable (e.g., as illustrated and described below with respect to FIGS. 11A-11C and 15A-15C) and/or a probe 18 that is disposed in material that is configured to expose the probe 18 only when pressure is applied to the material. Additionally, it is contemplated that such safety features can be included in the embodiment described and illustrated above with respect to FIG. 2.

The probe 18 is electrically coupled to a polarity selector switch 16, which is positioned on a top surface of the housing 510 as shown in FIG. 10A. It is contemplated that, according to other embodiments, the polarity selector switch 16 can be positioned on any other surface of the diagnostic device 500. The polarity selector switch 16 is biased to a center-off position and includes a positive position to the left (relative to the top view shown in FIG. 10A) of the center-off position and a negative position to the right of the center-off position, as explained above with respect to FIGS. 1-5B. The polarity selector switch 16 is electrically coupled to the power conversion module 14, and the power conversion module 14 is electrically coupled to the plug 16. The power conversion module 14 can be disposed in the housing 510, a plug housing (not shown), or a separate housing on an exterior of the housing 510 or along a cord between the housing 510 and a plug housing.

Optionally, the diagnostic device 500 can further include a storage compartment 522 for storing replacement LEDs or replacement fuses, an LED tester 525 including metal contacts for individually testing an LED (e.g., a replacement LED), an LED puller device 524 to assist in the removal of replacement LEDs from an LED light string, a fuse tester 526 including metal contacts for testing fuses of an LED light string, and an indicator light 528 for providing an indication of whether a fuse connected to the fuse tester is defective or in good working condition. These optional features can also be implemented for the diagnostic device 10 illustrated in FIG. 2.

FIGS. 10D-10F show the diagnostic device 500 being coupled to the third wire 58c of the LED light string 50. FIG. 10D shows the trigger 520 in the second position and the door 514 in the open position. With the door 514 in the open position, access is provided to the light-string-receiving portion 512 of the housing 510. The third wire 58c of the LED light string 50 is placed in the light-string-receiving portion 512. As shown in FIG. 10E, when the trigger 520 is released so as to move from the second position to the first position, the door 514 and the probe 18 also move from the open position towards the closed position. The door 514 and the probe 18 contact the third wire 58c of the LED light string 50 as the door 514 and probe 18 move towards the closed position, thereby moving the third wire 58c towards a contact surface 530 within the light-string-receiving portion 512 of the housing 510. As shown in FIG. 10F, when the third wire 58c contacts the contact surface 530 of the light-string-receiving portion 512, further movement of the third wire 58c is prevented or substantially inhibited. The continued force of the door 514 and the probe 18 on the third wire 58c causes the probe 18 to penetrate the insulation of the third wire 58c and contact the third conductor 60c of the third wire 58c. The defect identification process and repair of the LED light string can then be performed as described above with respect to FIGS. 3A-7E.

Figure 11A:
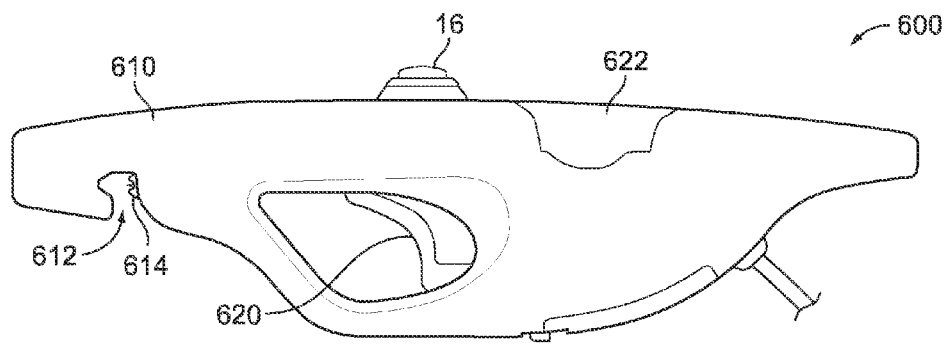
FIGS. 11A-11C are illustrations of another exemplary diagnostic device according to aspects of the present invention.
Figure 11B:
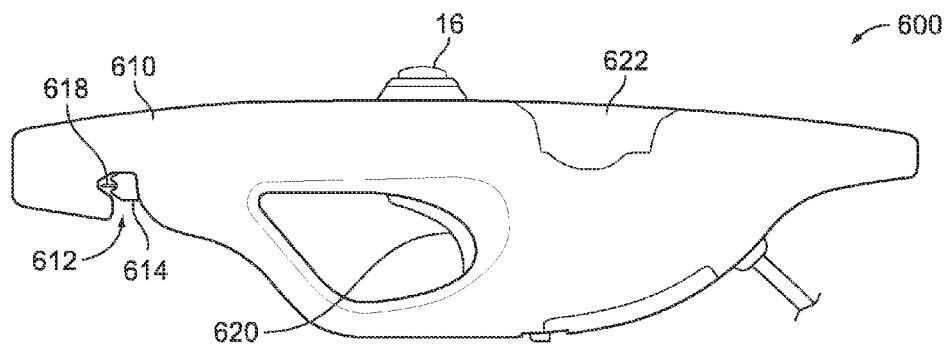
Figure 11C:
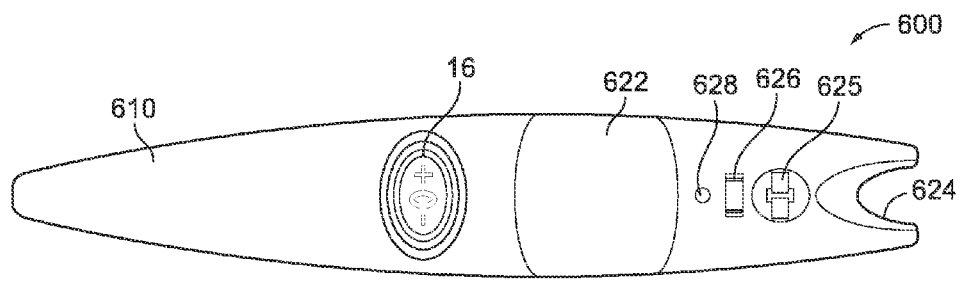

Referring now to FIGS. 11A-11C, yet another exemplary diagnostic device 600 for implementing a diagnostic device circuit (e.g., the diagnostic device circuit 8 illustrated in FIG. 1) is shown. The diagnostic device 600 includes a portable, hand-held housing 810 having a light-string-receiving portion 612, a door 614, a trigger 620, a polarity switch 16, and a probe 18, which operate in a substantially similar manner to the corresponding features of the diagnostic device 500 described above with respect to FIGS. 10A-10F. However, in the exemplary embodiment of FIGS. 11A-11C, the door 614 is operatively connected to the trigger 620 such that when the trigger 620 is actuated from a first position (as shown in FIG. 11A) to a second position (as shown in FIG. 11B), the door 614 moves from an open position (providing access to the light-string-receiving portion 412) to a closed position (preventing or inhibiting access to the light-string-receiving portion 412). Additionally, the diagnostic device 600 is configured such that the probe 18 is retracted within the door 614 when the door 614 is in the open position (as shown in FIG. 11A) and the probe 18 is extended from the door 614 when the door 614 is in the closed position (as shown in FIG. 11B). As shown in FIG. 11C, the diagnostic device 600 also includes a storage compartment 622 for storing replacement LEDs or replacement fuses, an LED tester 625 including metal contacts for individually testing an LED (e.g., a replacement LED), an LED puller device 624 to assist in the removal of replacement LEDs from an LED light string, a fuse tester 626 including metal contacts for testing fuses of an LED light string, and an indicator light 628 for providing an indication of whether a fuse connected to the fuse tester is defective or in good working condition.

In the embodiments illustrated and described above for FIGS. 1-5B and 10A-11C, the probe 18 is configured to penetrate the insulation layer and contact the conductor of an LED light string; however, it is contemplated that according to other aspects a probe can be configured to contact the conductor of an LED light string without penetrating the insulation layer of an LED light string. For example, according to some embodiments, a probe can be configured to contact the conductor of an LED light string within an LED socket from which a replaceable LED light bulb is removed. Accordingly, in such embodiments, the probe can have a shape and a size suitable to facilitate insertion of the probe in an LED socket and facilitate electrical coupling of the probe to the conductor within the LED socket. As non-limiting examples, the probe can have a generally cylindrical shape, a generally conical shape, a shape corresponding to the shape of an LED socket, or a shape similar to the shape of a portion of a replaceable LED.

Figure 12A:
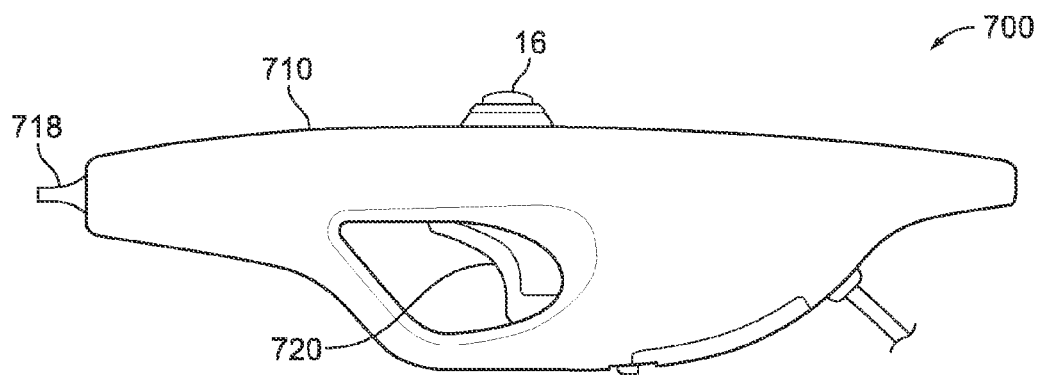
FIGS. 12A-12B are illustrations of yet another exemplary diagnostic device according to aspects of the present invention.
Figure 12B:
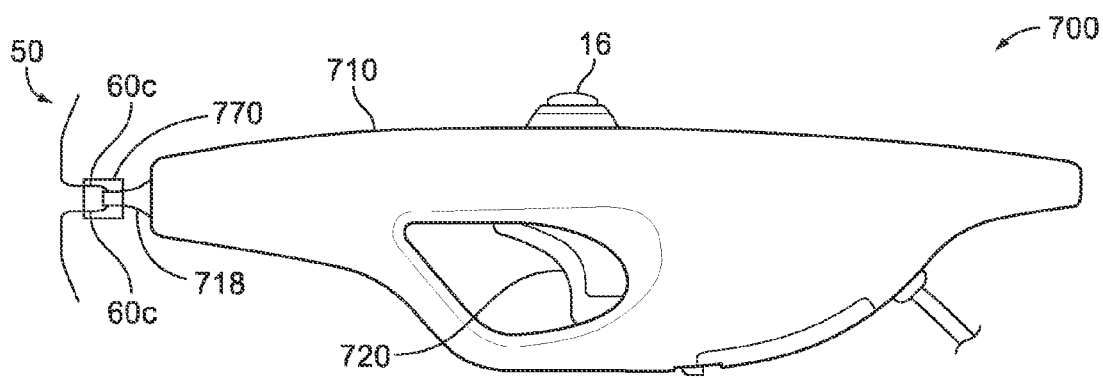

FIGS. 12A and 12B illustrate one non-limiting example of a diagnostic device 700 having a probe 718 configured to be received in an LED socket 770 of an LED light string 50 to contact a conductor 60c of the LED light string 50. In the illustrated embodiment, the probe 718 has a generally conical shape. The diagnostic device 700 further includes a housing 710 and a polarity switch 16, which operate with the probe 718 in a manner similar to that described above. FIG. 12B shows the diagnostic device 700 being coupled to the conductor 60c of the LED light string 50 via the LED socket 770 from which a replaceable LED (not shown) was removed. As shown in FIG. 12B, the probe 718 is configured to contact and electrically couple to the conductor 60c within the LED socket 770.

The defect identification process thus can be performed by removing a replaceable LED from the light string 50 at a testing location, coupling the probe 718 to the conductor 60c via the LED socket 770 of the removed replaceable LED, operating the polarity selector switch 16, reinserting the removed replaceable LED in the LED socket 770, and repeating at other testing locations until the defect is identified as described above.

The diagnostic device 700 can optionally include any of the other features described above (e.g., a storage compartment, an LED tester, an LED puller device, a fuse tester, etc.). Additionally, while the probe 718 is located at a distal end of the housing 710 in the illustrated embodiment, it is contemplated that the probe 718 can be disposed at any other suitable location on the housing including, for example, within a light-string-receiving portion of the housing 710.

It is contemplated that according to some aspects, a trigger 720 can be optionally included to, for example, control the electrical power provided to the probe 718 and/or to retract or extend the probe 718 from the housing 710. Thus, a trigger 720 can be provided as an additional safety feature to prevent or inhibit the user from accidentally contacting a live electrical circuit via the probe 718 when the probe 718 is not inserted in an LED socket 770.

Figure 13:
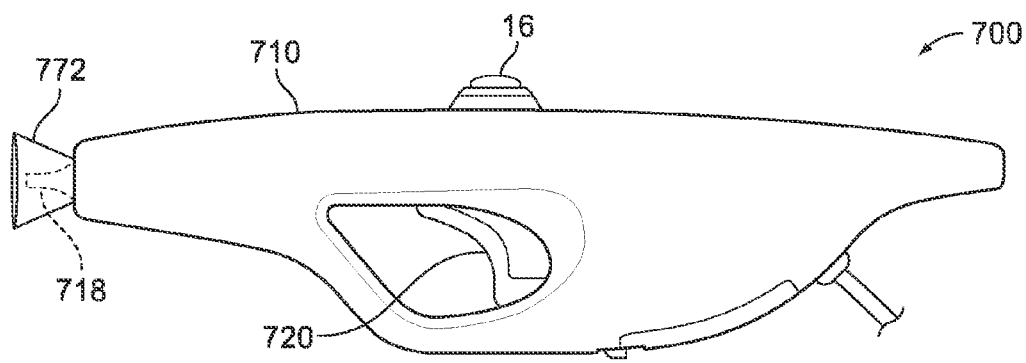
FIG. 13 is an illustration of the diagnostic device illustrated in FIG. 12A including a shroud.

Another optional safety feature is shown in FIG. 13. As shown in FIG. 13, the diagnostic device 700 can optionally include a shroud 772 within which the probe 718 is disposed. The shroud 772 is configured to inhibit access to the probe 718 yet still permit the probe 718 to couple to an LED socket 770. For example, the shroud 772 can be configured to receive the LED socket 770 within the shroud 772 when the probe 718 is coupled to the LED socket 770.

While the probe 718 of the illustrated embodiment is generally conical in shape, it is contemplated that the probe 718 can have any other suitable shape, as explained above. In one alternative configuration, the probe 718 can be plug-shaped (i.e., a shape corresponding to the shape of the LED socket 770 and/or the shape of a portion of a replaceable LED). In such embodiments, a two-pole switch can be included in the diagnostic device circuit (e.g., the diagnostic device circuit 8 illustrated and described for FIG. 1) so that the polarity is reversed simultaneously on both portions of the conductor 60c within the LED socket 770 when coupled to the probe 718.

Figure 14:
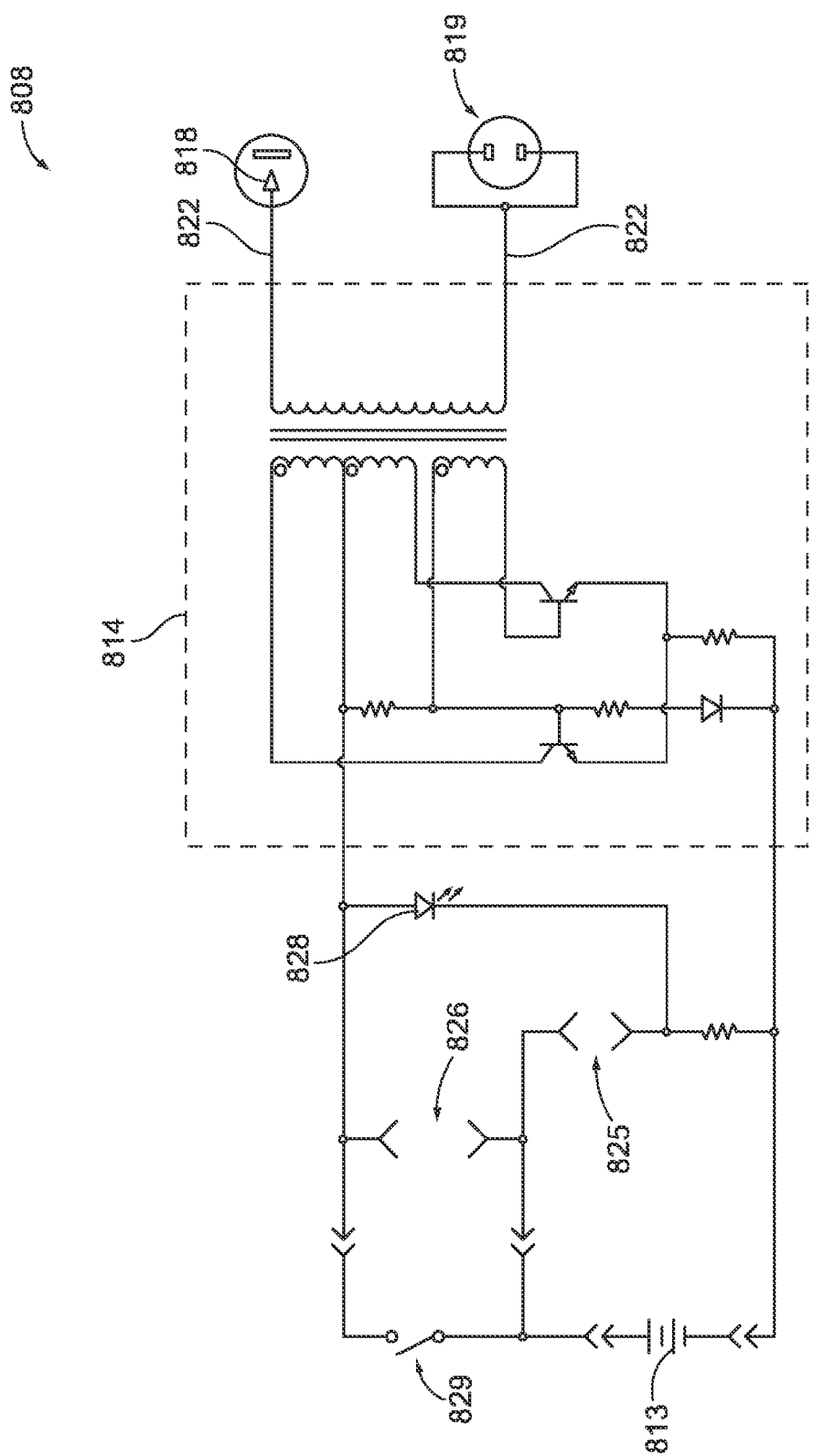
FIG. 14 is a diagram of a diagnostic device circuit according to additional aspects of the present invention.

Referring now to FIG. 14, a diagram of another exemplary diagnostic device circuit 808 for identifying defects in an LED light string is illustrated. The diagnostic device circuit 808 includes a power source 813, a power conversion module 814, a probe 818, and an electrical socket 819. The power source 813 is configured to provide DC electrical power to the power conversion module 814. As one non-limiting example, the power source 813 can include a 9 V battery. According to some embodiments, the power source 813 can be electrically coupled to the power conversion module 813 and optional features such as, for example, an LED tester 825, a fuse tester 826, a power-indicator light 828, and a power-control switch 829. The power-control switch 829 can be communicatively coupled with a trigger, a switch, a button, combinations thereof, or the like to provide a safety feature and also preserve the life of the power source 813.

Figure 14A:
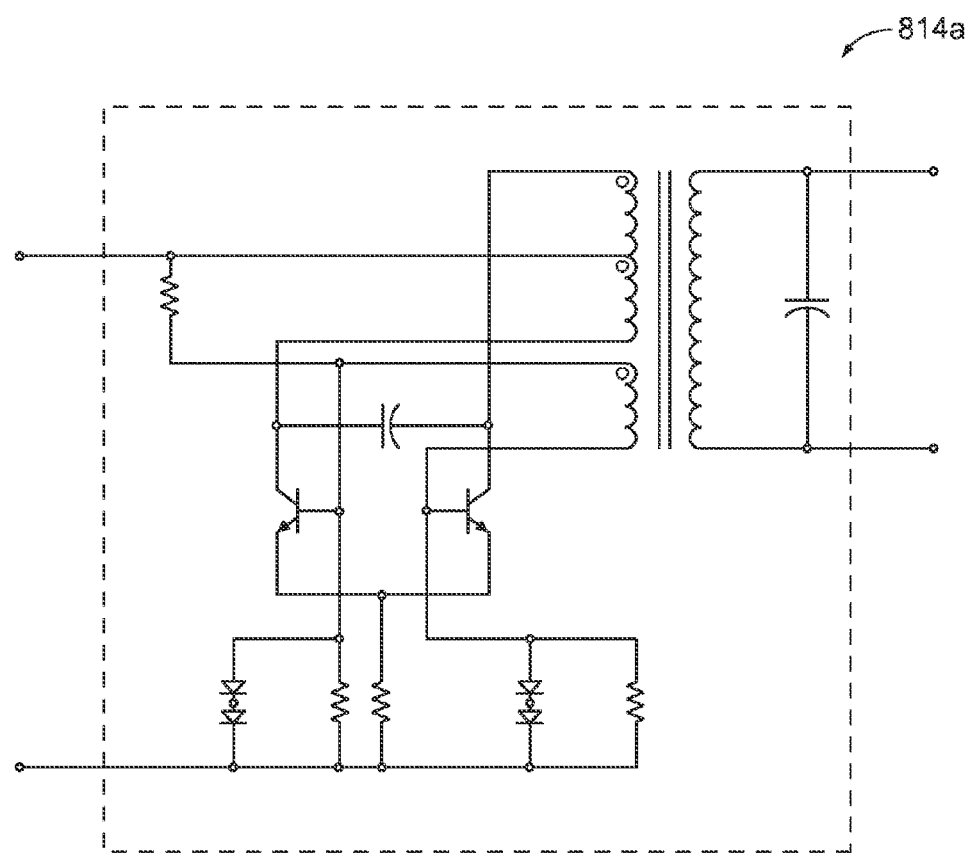
FIG. 14A is a diagram of a diagnostic device circuit according to additional aspects of the present invention.

The power conversion module 814 includes electronic circuitry for processing the electrical power received from the power source 813 so as to provide a power source suitable for use by the diagnostic device circuit 8. In particular, the power conversion module 814 is configured to receive the DC electrical power from the power source 814 and provide an AC electrical power to the probe 818 and the electrical socket 819, which are electrically coupled to outputs 822 of the power conversion module 814. For example, in the exemplary circuit 808 illustrated in FIG. 14, the power conversion module 814 includes an inverter circuit for changing the DC electrical power to an AC electrical power. However, it is contemplated that, according to other embodiments, the power conversion module 814 can include any other suitable circuitry such as, for example, an integrated circuit configured to change the DC electrical power to the AC electrical power. Another non-limiting example of a circuit 814a for implementing the power conversion module 814 is illustrated in FIG. 14A.

In one non-limiting example, the inverter circuit can be configured to change the received DC electrical power signal to an AC electrical power signal on the order of approximately 100 $V_{RMS}$ (with no load) and approximately 5 mA. According to other non-limiting examples, the inverter circuit can be configured to provide a current in a range of approximately 1 mA to approximately 20 mA or in a range of approximately 5 mA to approximately 10 mA. Still further it is contemplated that the magnitude of the current provided by the power conversion module 814 to the probe 818 and the electrical socket 819 can be limited to mitigate risks of a current magnitude that is greater than the safe operating conditions of an LED, risks of damage to an LED light string or the diagnostic device 800 in a short condition, and/or risks of electrical shock to a user or accidental destruction of LEDs.

Figure 15A:
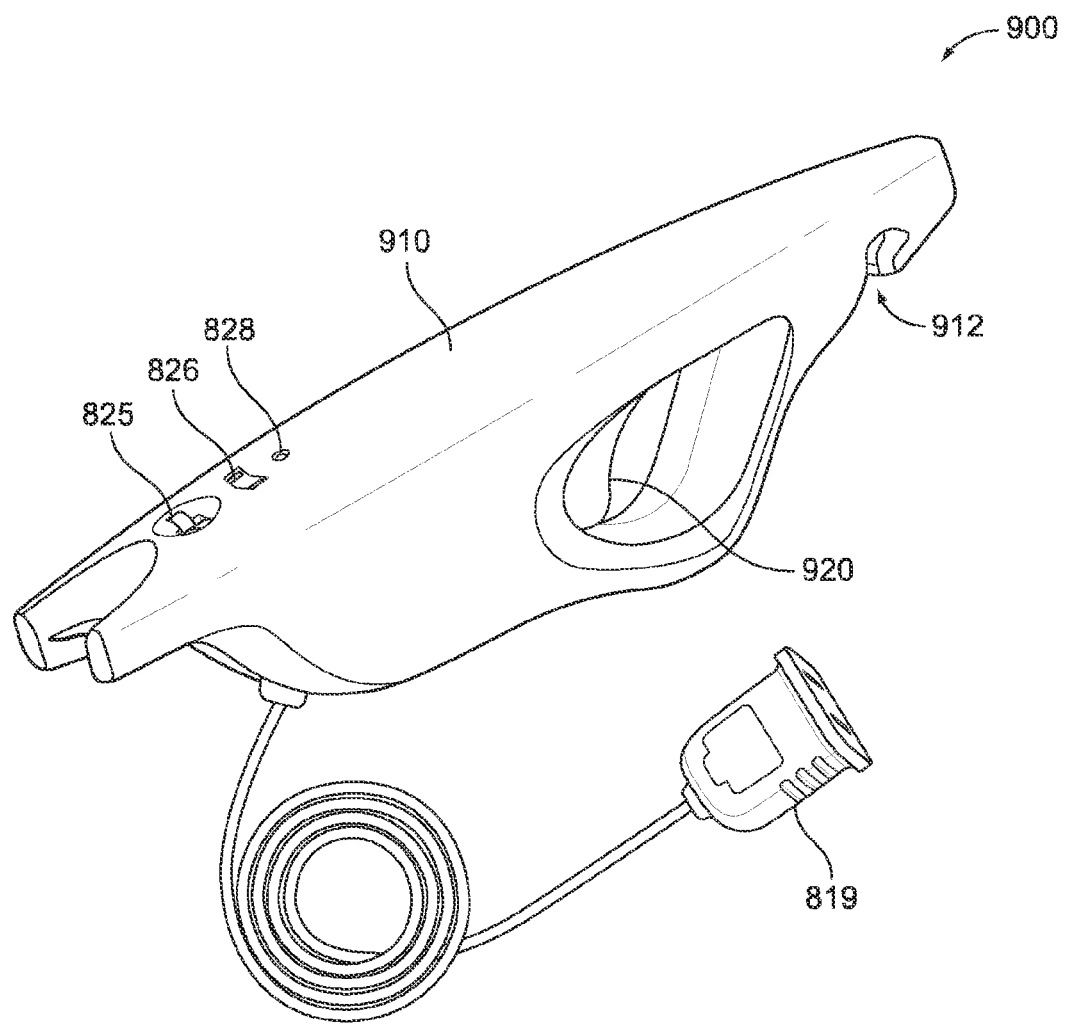
FIGS. 15A-15C are illustrations of an exemplary diagnostic device for the circuit diagram illustrated in FIG. 14.
Figure 15B:
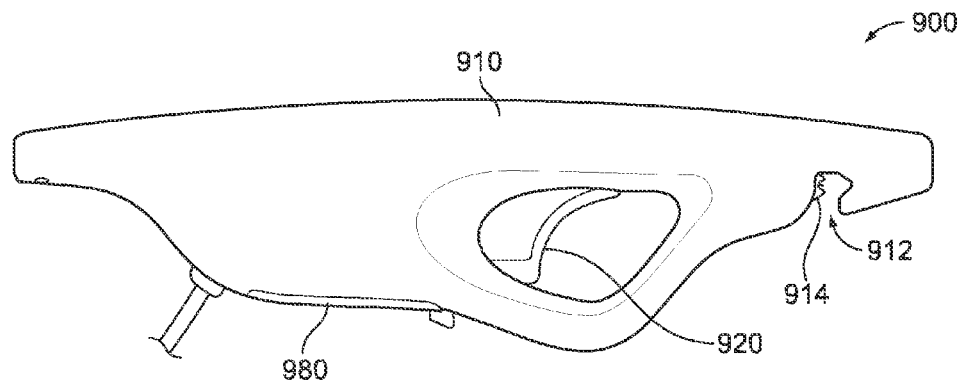
Figure 15C:
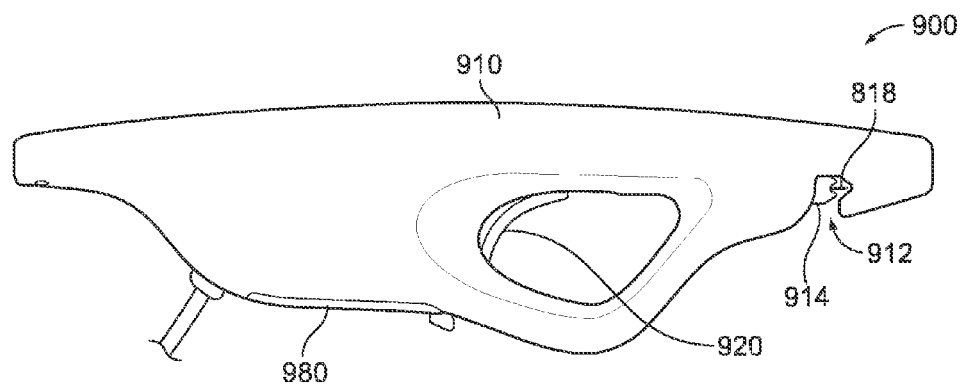

FIGS. 15A-C illustrate an exemplary diagnostic device 900 for implementing the diagnostic device circuit 808 illustrated in FIG. 14. The diagnostic device 900 includes a portable, hand-held housing 910 having a light-string-receiving portion 912 located on a lower periphery surface of the housing 910. The housing 910 can be made partially or entirely from a non-conductive material(s) so as to mitigate the risk of electrical shock to a user. The diagnostic device 900 also includes the optional LED tester 825, fuse tester 826, and power-indicator light 828. The diagnostic device 900 can also optionally include a cover 980 for accessing a compartment in which the power source 813 is disposed.

The diagnostic device 900 further includes a door 914 disposed within the light-string-receiving portion 912 of the housing 910. Similar to the diagnostic device 400 described above, the door 914 is operatively connected to a trigger 920 such that when the trigger 920 is actuated from a first position (as shown in FIG. 15B) to a second position (as shown in FIG. 15C), the door 914 moves from an open position (providing access to the light-string-receiving portion 912) to a closed position (preventing or inhibiting access to the light-string-receiving portion 912). In other words, the door 914 is biased towards the open position. Also, as described above, the door 914 can include a generally curved or concave profile configured to receive a wire of the LED light string 50.

In the illustrated embodiment, the trigger 920 is also configured to actuate the power-control switch 829. In particular, when the trigger 920 is actuated from the first position to the second position, the power-control switch 829 is actuated from an open circuit condition to a closed circuit condition. Accordingly, the trigger 920 can be configured to control whether the DC electrical power is provided from the power source 813 to the power conversion module 814.

The probe 818 is operatively coupled to the trigger 920 such that the probe 818 is retracted within the door 914 when the door 914 is in the open position (as shown in FIG. 15B) and the probe 818 is extended from the door 914 into the light-string-receiving portion 912 when the door 914 is in the closed position (as shown in FIG. 15C). The probe 818 is configured to penetrate an insulation layer and electrically couple to a conductor of a wire of an LED light string. For example, as described above, the probe 818 can be made of a conductive material and have a generally pin shape with a pointed tip. Additionally, the probe 818 can have a diameter or other cross-sectional dimensions that are sufficiently small so as to prevent or substantially inhibit any damage to the insulation of the LED light string and sufficiently large so as to withstand repeated couplings with an LED light string. As one non-limiting example, the probe 818 can have a diameter of approximately 0.025 inches (i.e., approximately 0.635 millimeters).

Similar to the embodiments described above, to identify a defect in an LED light string (e.g., the LED light string 50 illustrated in FIG. 3A), the LED light string and the diagnostic device 900 are coupled to a common power source (i.e., the power source 813). As explained above, the diagnostic device 900 includes the power source 813 for providing electrical power to the diagnostic device circuitry 808. The LED light string also can be coupled to the power source 813 via the electrical socket 819. In particular, the plug of the LED light string (e.g., the plug 52 of the light string 50) can be electrically coupled to the electrical socket 819 to couple the LED light string to the power source 813.

Once the LED light string is coupled to the power source 813, the probe 818 of the diagnostic device 900 is coupled to the conductor of the LED light string at a testing location by placing a wire of the LED light string in the light-string-receiving portion 912 and actuating the trigger 920. Actuating the trigger 920 causes the probe 818 to penetrate the insulation of the wire of the LED light string and contact the conductor of the LED light string. Actuating the trigger 920 also causes the power-control switch 829 to close, providing the DC electrical power from the power source 813 to the power conversion module 814. The power conversion module 814 changes the DC electrical power to an AC electrical power and provides the AC electrical power to the probe 818 and the electrical socket 819 via the outputs 822. With the probe 818 coupled to the conductor of the LED light string and the LED light string coupled to the socket 819, the AC electrical power flows to the conductor (which includes the LEDs) of the LED light string.

Because the electrical power provided to the LED light string via the probe 818 and the socket 819 is an AC electrical power, current flows through the portion of the conductor on one side of the probe 818 for the positive half-wave cycle of the AC electrical power and current flows through the portion of the conductor on the other side of the probe 818 for the negative half-wave cycle of the AC electrical power. In other words, both sides of the LED light string (relative to the probe 818) are tested because an electrical signal having both positive and negative polarities is provided to the conductor of the LED light string via the probe 818 and the electrical socket 819. As such, the LED light string can be tested without the use of a polarity selector switch.

It is contemplated that the alternative and optional features described above with respect to FIGS. 1-5B and 10A-13 can also be implemented for the diagnostic device 900 of FIGS. 15A-C. For example, the diagnostic device 900 illustrated and described with respect to FIGS. 15A-C can include the probe 718 and/or the shroud 770 described and illustrated with respect to FIGS. 12A-13. Similarly, for example, the diagnostic device 900 can include a light-string-receiving portion 912 that is disposed on an upper periphery surface of the housing 910, the door 914 can be biased to a closed position, the trigger may not be coupled to the power-selector switch 829, etc.

It is further contemplated that the diagnostic devices 10, 500, 600, 700 and 900 can optionally include alignment indicia to assist a user with properly aligning the diagnostic device. For example, the alignment indicia can indicate to which side of the diagnostic device the light string plug and the light string socket should be so that the positions of the polarity selector switch correspond to the sides of the light sting to which current is provided.

Figure 16:
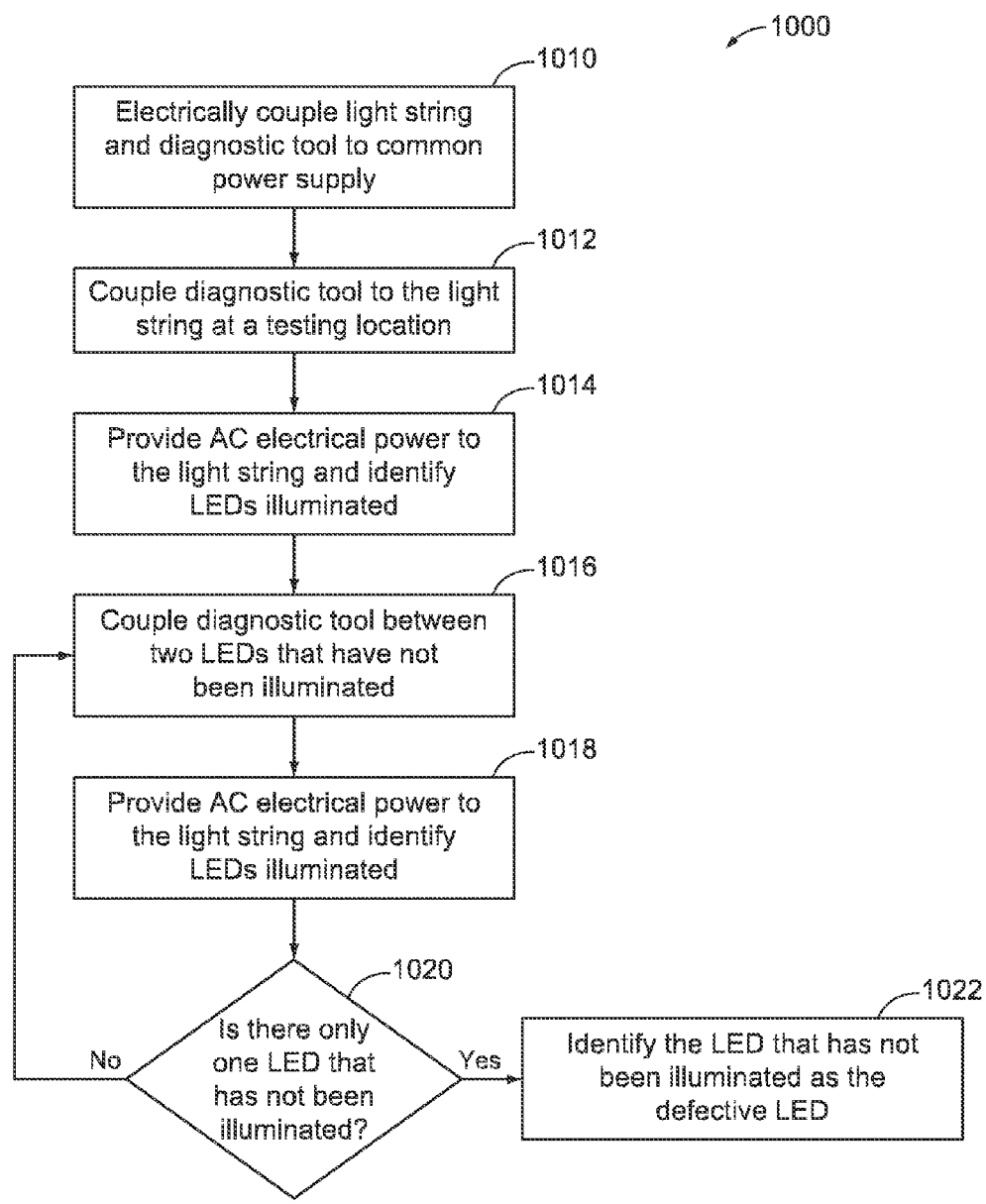
FIG. 16 is a flowchart of a process for identifying a defective LED in a decorative LED light string according to some aspects of the present invention.

Referring to FIG. 16, a flowchart for a process 1000 of identifying a defective LED in the LED light string is illustrated. At block 1010, the LED light string is electrically coupled to the electrical socket 819 of the diagnostic device 900. At block 1012, the probe 818 of the diagnostic device 900 is electrically coupled to the conductor of the LED light string between two LEDs. At block 1014, the AC electrical power is provided to the conductor of the light string (e.g., by actuating the trigger 920). Additionally, at block 1014, the LEDs that are illuminated in response to the AC electrical power being provided to the conductor of the LED light string are identified. At block 1016, the diagnostic tool 900 is coupled to the conductor between two LEDs that have not been illuminated during the process 1000. At block 1018, the AC electrical power is provided to the conductor of the LED light string (e.g., by actuating the trigger 920) and the LEDs that are illuminated are identified. At decision block 1020, it is determined whether there is only one LED that has not been previously illuminated during the process 1000. If it is determined that more than one LED has not been previously illuminated, the process 1000 returns to block 1016. If it is determined that only one LED has not been previously illuminated at block 1020, then that LED is identified as the defective LED at block 1022.

Figure 17A:
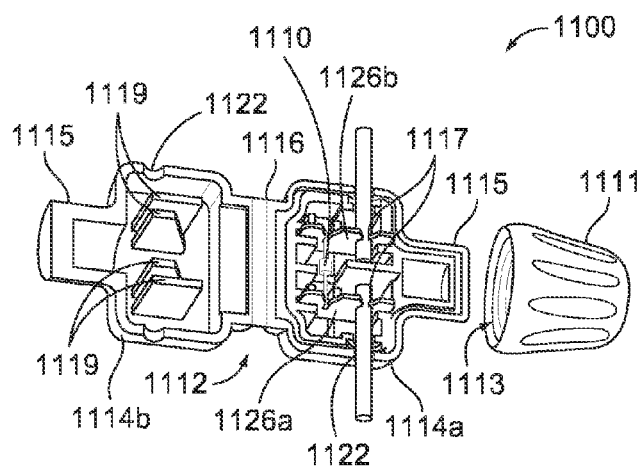
FIGS. 17A-17D illustrate another exemplary repair device for repairing a decorative LED light string having a defective LED according to some aspects of the present invention.
Figure 17B:
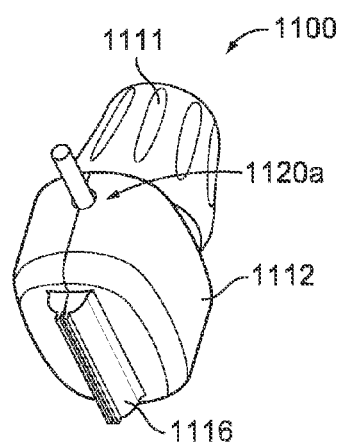
Figure 17C:
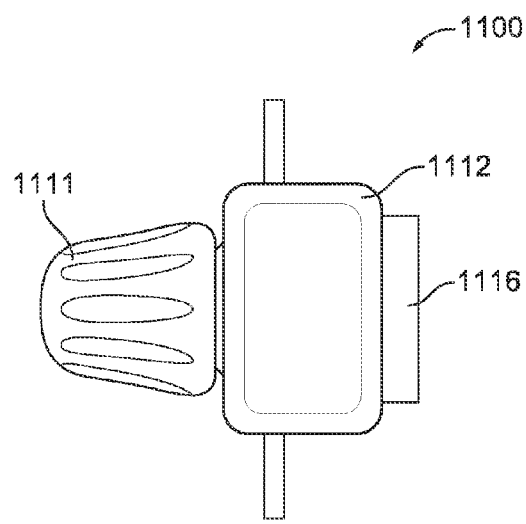
Figure 17D:
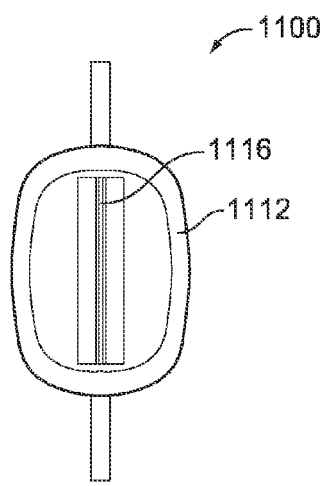

Referring now to FIGS. 17A-D, another exemplary repair device 1100 is shown. The repair device 1100 includes a housing 1112 and a cap 1111. FIG. 17A shows the repair device 1100 in an open position and FIGS. 17B-D show the repair device 1100 in a closed position. The cap 1111 includes a threaded portion 1113 on an internal surface of the cap 1111. The housing 1112 includes a first portion 1114a and a second portion 1114b. In the illustrated embodiment, the first portion 1114a is hingedly coupled to the second portion 1114b by, for example, a living hinge 1116. The first portion 1114a and the second portion 1114b each include a threaded section 1115, which are configured to be threadably coupled to the threaded portion 1113 of the cap 1111 when the repair device 1100 is in the closed position as shown in FIGS. 17B-D.

The first portion 1114a and the second portion 111b each include recessed surfaces 1122 that define a first wire-receiving cavity 1120a and a second wire-receiving cavity 1120b when the repair device 1100 is in the closed position. The first portion 1114a further includes a stop 1124 to assist in inserting wires into the first wire-receiving cavity 1120a and the second wire-receiving cavity 1120b. The first portion 1114a also includes a first wire-piercing element 1126a and a second wire-piercing element 1126b coupled to a resistor 1110. It is contemplated that, according to other embodiments, an LED can be coupled to the first wire-piercing element 1126a and the second wire-piercing element 1126b instead of or in addition to the resistor 1110, as explained above with respect to FIGS. 9A-E. The first wire-piercing element 1126a and the second wire-piercing element 1126b each include a notch 1117 aligned with the first wire-receiving cavity 1120a and the second wire-receiving cavity 1120b, respectively. The notches 1117 are configured to receive a wire, penetrate an insulation layer of the wire, and electrically couple to a conductor within the insulation layer.

The second portion 1114b includes coupling-assist structures 1119 that assist in coupling a wire to the first wire-piercing element 1126a and the second wire-piercing element 1126b. To couple the repair device 1100 to an LED light string (e.g., the LED light string 50), the cut ends of a wire of the LED light string are positioned on the recessed surfaces 1122 of the first portion 1114a and above the notches 1119. The first portion 1114a and the second portion 1114b are closed and the cap 1111 is threadably coupled to the housing 1112. As the first portion 1114a and the second portion 1114b are closed, the coupling-assist structures 1119 engage the wire in the wire-receiving cavities 1120a and 1120b, causing the cut ends of the wires to be forced into the notches 1119. As a result, the first wire-piercing element 1126a and the second wire-piercing element 1126b penetrate the insulation layer and electrically couple to the conductor of the wire. The cut ends of the wire are thus electrically coupled to one another via the resistor 1110.

It is contemplated that the cap 1111 and/or the threaded sections 1115 of the housing 1112 can be configured such that removal of the cap 1111 from the housing 1112 is substantially inhibited or prevented once the cap 1111 is threadably coupled to the threaded sections 1115 of the housing 1112. Additionally, it is contemplated that the repair device 1100 can include any of the features described or illustrated above with respect to the repair devices 200, 300, and 400, and vice versa. For example, the repair devices 200, 300, and 400 can include the wire-piercing elements 1126a and 1126b.

It is contemplated that a kit can include a diagnostic device (e.g., the diagnostic devices 10, 500, 600, 700, 900, or any combination of features thereof) and a repair device (e.g., the repair device 200, 300, 400, 1100, or any combination of features thereof). Additionally, it is contemplated that the kit can further comprise one or more of a replacement LED and a marker for marking the testing locations. Moreover, it will be understood by those skilled in the art that the features of the diagnostic devices disclosed herein can have different locations, shapes, sizes, and/or configurations than those illustrated.

While the present invention(s) have been described with reference to one or more particular embodiments, those skilled in the art will recognize that many changes may be made thereto without departing from the spirit and scope of the present invention(s). Each of these embodiments and obvious variations thereof is contemplated as falling within the spirit and scope of the invention(s), which are set forth in the following alternate embodiments.

The invention claimed is:

1. A diagnostic device for identifying a defect in a light emitting diode (LED) light string, the LED light string including a conductor disposed within an insulation layer and a plurality of light emitting diodes, the diagnostic device comprising:
a power source configured to provide a DC electrical power;
a power conversion module electrically coupled to the power source, the power conversion module being configured to receive the DC electrical power, convert the DC electrical power to an AC electrical power, and provide the AC electrical power to a first output and a second output, the AC electrical power being configured to illuminate one or more of the plurality of light emitting diodes;
a probe electrically coupled to the first output of the power conversion module; and
an electrical socket electrically coupled to the second output of the power conversion module,
wherein the probe is configured to electrically couple to the conductor of the LED light string and the electrical socket is configured to electrically couple to a plug of the LED light string such that a first portion of the LED light string is illuminated and a second portion of the LED light string is not illuminated in response to the AC electrical power provided to the LED light string when the probe is electrically coupled to the conductor of the LED light string and the electrical socket is electrically coupled to the plug of the LED light string, the first portion omitting the defect in the LED light string and the second portion including the defect in the LED light string.

2. The diagnostic device of claim 1, wherein the probe is configured to penetrate the insulation layer and contact the conductor of the LED light string.

3. The diagnostic device of claim 1, wherein the probe is configured to couple to an LED socket of the LED light string to contact the conductor of the LED light string.

4. The diagnostic device of claim 3, further comprising a shroud, the probe being disposed within an interior space of the shroud.

5. The diagnostic device of claim 3, wherein the probe has a generally conical shape.

6. The diagnostic device of claim 3, wherein the probe has a shape that generally corresponds to the shape of a plug of one of the plurality light emitting diodes.

7. A diagnostic device for identifying a defect in a light emitting diode (LED) light string, the LED light string including a conductor disposed within an insulation layer and a plurality of light emitting diodes, the diagnostic device comprising:
a power source configured to provide a DC electrical power;
a power conversion module electrically coupled to the power source, the power conversion module being configured to receive the DC electrical power, convert the DC electrical power to an AC electrical power, and provide the AC electrical power to a first output and a second output, the AC electrical power being configured to illuminate one or more of the plurality of light emitting diodes;
a probe electrically coupled to the first output of the power conversion module;
an electrical socket electrically coupled to the second output of the power conversion module;
wherein the probe is configured to electrically couple to the conductor of the LED light string and the electrical socket is configured to electrically couple to a plug of the LED light string such that a first portion of the LED light string is illuminated and a second portion of the LED light string is not illuminated in response to the AC electrical power provided to the LED light string when the probe is electrically coupled to the conductor of the LED light string and the electrical socket is electrically coupled to the plug of the LED light string, the first portion omitting the defect in the LED light string and the second portion including the defect in the LED light string;
a housing including a light-string-receiving portion configured to receive the insulation layer and the conductor of the LED light string; and
a door having an open position for providing access to the light-string-receiving portion and a closed position for inhibiting access to the light-string-receiving portion.

8. The diagnostic device of claim 7, wherein the probe extends from a front end of the door.

9. The diagnostic device of claim 8, wherein the door includes a peripheral surface that extends across an opening in the light-string-receiving portion when the door is in the closed position, the front end of the door having a curved profile such that the peripheral surface extends over a tip of the probe.

10. The diagnostic device of claim 8, further comprising a trigger for actuating the door between the open position and the closed position.

11. The diagnostic device of claim 10, wherein the probe is retractably disposed in the door, the trigger, the door, and the probe being configured such that the probe protracts from the door in response to actuation of the trigger.

12. A diagnostic device for identifying a defect in a light emitting diode (LED) light string, the LED light string including a conductor disposed within an insulation layer and a plurality of light emitting diodes, the diagnostic device comprising:

a probe configured to electrically couple to the conductor of the LED light string;
a polarity selector switch electrically coupled to the probe, the polarity selector switch being configured to control the polarity of an electrical waveform provided to the probe;
a power conversion module configured to be selectively coupled to the polarity selector switch at a positive output and a negative output, the power conversion module being configured to provide a positive polarity waveform at the positive output and a negative polarity waveform at the negative output, the polarity selector switch including a negative position in which the probe is electrically coupled to the negative output, and the polarity selector switch including a positive position in which the probe is electrically coupled to the positive output; and
a plug configured to electrically couple the power conversion module to an AC electrical power source,
wherein the probe, the polarity selector switch, the power conversion module, and the plug are configured such that when the LED light string is electrically coupled to the power source, the plug is electrically coupled to the power source, and the probe is electrically coupled to the conductor:
a first portion of the LED light string is illuminated if the polarity selector switch is in the positive position and a second portion of the LED light string contains the defect,
the second portion of the LED light string is illuminated if the polarity selector switch is in the negative position and the first portion of the LED light string contains the defect, and
the first portion and the second portion of the LED light string are not illuminated if the polarity selector switch is in the positive position and the first portion of the LED light string contains the defect or the polarity selector switch is in the negative position and the second portion of the LED light string contains the defect.

13. The diagnostic device of claim 12, wherein the power conversion module includes a diode bridge configured to provide full-wave rectification, a first resistor electrically coupled to the positive output, and a second resistor electrically coupled to the negative output.

14. The diagnostic device of claim 13, wherein the polarity selector switch includes a center-off position in which the probe is not electrically coupled to the positive output and the probe is not electrically coupled to the negative output.

15. The diagnostic device of claim 14, wherein the positive position of the polarity selector switch relative to the center-off position corresponds to a direction of illumination of the LED light string relative to diagnostic device when no defect exists in the direction.

16. The diagnostic device of claim 12, further comprising:
a housing including a light-string-receiving portion configured to receive the insulation layer and the conductor of the LED light string;
a door having an open position for providing access to the light-string-receiving portion and a closed position for inhibiting access to the light-string-receiving portion; and
a trigger for actuating the door between the closed position and the open position.

17. The diagnostic device of claim 12, further comprising an alignment indicia on the housing for indicating an alignment of the diagnostic device relative to the LED light string.

18. The diagnostic device of claim 12, wherein the probe is configured to penetrate the insulation layer and contact the conductor of the LED light string.

19. A method of identifying a defect in a light emitting diode (LED) light string having a first end and a second end, comprising:
providing a LED light string having a plug, a plurality of light emitting diodes between the first end and the second end, and a conductor disposed within an insulation layer extending from the first end to the second end;
coupling the plug of the LED light string to a power source;
providing a diagnostic device that includes:
a probe configured to be electrically coupled to the conductor disposed within the insulation layer of the LED light string, and
a power conversion module for providing an electrical power configured to illuminate one or more of the plurality of light emitting diodes via the probe;
coupling the probe to the conductor of the LED light string at a testing location on the LED light string between the first end and the second end;
providing the electrical power from the power conversion module to the conductor of the LED light string at the testing location to cause one of a first portion of the LED light string between the testing location and the first end or a second portion of the LED light string between the testing location and the second end to be illuminated while the other remains not illuminated; and
in response to the providing the electrical power, determining the location of the defect based on whether the first portion of the LED light string or the second portion of the LED light string is illuminated, the defect of the LED light string being located in the one of the first portion or the second portion that is not illuminated.

20. The method of claim 19, wherein the power conversion module is configured to receive the DC electrical power, convert the DC electrical power to an AC electrical power, and provide the AC electrical power to a first output and a second output, the AC electrical power being configured to illuminate one or more of the plurality of light emitting diodes, the power conversion module further including an electrical socket coupled to the second output of the power conversion module, coupling the plug of the LED light string to a power source including coupling the plug of the LED light string to the electrical socket of the diagnostic device.

21. The method of claim 19, wherein the probe is configured to penetrate the insulation layer and contact the conductor of the LED light string.

22. A method of identifying a defect in a light emitting diode (LED) light string having a first end and a second end, comprising:
providing a LED light string having a plug, a plurality of light emitting diodes between the first end and the second end, and a conductor disposed within an insulation layer extending from the first end to the second end;
coupling the plug of the LED light string to a power source;

providing a diagnostic device that includes:
　　a probe configured to be electrically coupled to the conductor disposed within the insulation layer of the LED light string, and
　　a power conversion module for providing an electrical power configured to illuminate one or more of the plurality of light emitting diodes via the probe;
coupling the probe to the conductor of the LED light string at a testing location on the LED light string between the first end and the second end;
providing the electrical power from the power conversion module to the conductor of the LED light string at the testing location to cause one of a first portion of the LED light string between the testing location and the first end or a second portion of the LED light string between the testing location and the second end to be illuminated while the other remains not illuminated; and
in response to the providing the electrical power, determining the location of the defect based on whether the first portion of the LED light string or the second portion of the LED light string is illuminated, the defect of the LED light string being located in the one of the first portion or the second portion that is not illuminated,
wherein the diagnostic device further includes a polarity selector switch electrically coupled to the probe, the polarity selector switch being configured to control the polarity of an electrical waveform provided to the probe, the power conversion module being configured to be selectively coupled to the polarity selector switch at a positive output and a negative output, the power conversion module being further configured to provide a positive polarity waveform at the positive output and a negative polarity waveform at the negative output, the polarity selector switch including a negative position in which the probe is electrically coupled to the negative output, and the polarity selector switch including a positive position in which the probe is electrically coupled to the positive output, the power source being an AC electrical power source, the diagnostic device further including a diagnostic-device plug configured to electrically couple the power conversion module to the AC electrical power source, the method further including coupling the diagnostic-device plug to the AC electrical power source.

23. A method of identifying a defect in a light emitting diode (LED) light string having a first end and a second end, comprising:
　providing a LED light string having a plug, a plurality of light emitting diodes between the first end and the second end, and a conductor disposed within an insulation layer extending from the first end to the second end;
　coupling the plug of the LED light string to a power source;
　providing a diagnostic device that includes:
　　a probe configured to be electrically coupled to the conductor disposed within the insulation layer of the LED light string, and
　　a power conversion module for providing an electrical power configured to illuminate one or more of the plurality of light emitting diodes via the probe;
　coupling the probe to the conductor of the LED light string at a testing location on the LED light string between the first end and the second end;
　providing the electrical power from the power conversion module to the conductor of the LED light string at the testing location to cause one of a first portion of the LED light string between the testing location and the first end or a second portion of the LED light string between the testing location and the second end to be illuminated while the other remains not illuminated;
　in response to the providing the electrical power, determining the location of the defect based on whether the first portion of the LED light string or the second portion of the LED light string is illuminated, the defect of the LED light string being located in the one of the first portion or the second portion that is not illuminated;\
　coupling the probe to a second testing location near a middle of the one of the first portion or the second portion that was not illuminated in response to the providing the electrical power;
　providing the electrical power from the power conversion module to the conductor of the LED light string at the second testing location to cause one of a third portion of the LED light string between the second testing location and the first end or a fourth portion of the LED light string between the second testing location and the second end to be illuminated while the other remains not illuminated; and
　determining the location of the defect based on whether the third portion of the LED light string or the fourth portion of the LED light string is illuminated.

24. The method of claim 23, further comprising marking the testing location with a marker.

25. A method of identifying a defect in a light emitting diode (LED) light string having a first end and a second end, comprising:
　providing a LED light string having a plug, a plurality of light emitting diodes between the first end and the second end, and a conductor disposed within an insulation layer extending from the first end to the second end;
　coupling the plug of the LED light string to a power source;
　providing a diagnostic device that includes:
　　a probe configured to be electrically coupled to the conductor disposed within the insulation layer of the LED light string, and
　　a power conversion module for providing an electrical power configured to illuminate one or more of the plurality of light emitting diodes via the probe;
　coupling the probe to the conductor of the LED light string at a testing location on the LED light string between the first end and the second end;
　providing the electrical power from the power conversion module to the conductor of the LED light string at the testing location to cause one of a first portion of the LED light string between the testing location and the first end or a second portion of the LED light string between the testing location and the second end to be illuminated while the other remains not illuminated;
　in response to the providing the electrical power, determining the location of the defect based on whether the first portion of the LED light string or the second portion of the LED light string is illuminated, the defect of the LED light string being located in the one of the first portion or the second portion that is not illuminated;

repairing the defect by attaching a repair device to the conductor on opposing sides of the location of the defect, the repair device including:
a repair device housing, and
a resistor disposed within the repair housing, the resistor including a first wire-piercing element and a second wire-piercing element, the first wire-piercing element and the second wire-piercing element penetrating the insulation layer and contacting the conductor of the LED light string.

26. A method of identifying a defect in a light emitting diode (LED) light string having a first end and a second end, comprising:
providing a LED light string having a plug, a plurality of light emitting diodes between the first end and the second end, and a conductor disposed within an insulation layer extending from the first end to the second end;
coupling the plug of the LED light string to a power source;
providing a diagnostic device that includes:
  a probe configured to be electrically coupled to the conductor disposed within the insulation layer of the LED light string, and
  a power conversion module for providing an electrical power configured to illuminate one or more of the plurality of light emitting diodes via the probe;
coupling the probe to the conductor of the LED light string at a testing location on the LED light string between the first end and the second end;
providing the electrical power from the power conversion module to the conductor of the LED light string at the testing location to cause one of a first portion of the LED light string between the testing location and the first end or a second portion of the LED light string between the testing location and the second end to be illuminated while the other remains not illuminated;
in response to the providing the electrical power, determining the location of the defect based on whether the first portion of the LED light string or the second portion of the LED light string is illuminated, the defect of the LED light string being located in the one of the first portion or the second portion that is not illuminated;
repairing the defect by attaching a repair device to the conductor on opposing sides of the location of the defect, the repair device including:
a repair device housing, and
a repair-device light emitting diode disposed within the repair housing, the repair-device light emitting diode including a first wire-piercing element and a second wire-piercing element, the first wire-piercing element and the second wire-piercing element penetrating the insulation layer and contacting the conductor of the LED light string, the repair-device light emitting diode being exposed within an aperture of the repair device housing.

* * * * *